(12) United States Patent
Wu et al.

(10) Patent No.: US 9,595,320 B2
(45) Date of Patent: Mar. 14, 2017

(54) OPTIMIZATION OF READ THRESHOLDS FOR NON-VOLATILE MEMORY

(71) Applicant: Seagate Technology LLC, Cupertino, CA (US)

(72) Inventors: Yingquan Wu, Palo Alto, CA (US); Earl T Cohen, Oakland, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/687,686

(22) Filed: Apr. 15, 2015

(65) Prior Publication Data

US 2015/0287453 A1    Oct. 8, 2015

Related U.S. Application Data

(63) Continuation of application No. 13/533,130, filed on Jun. 26, 2012, now abandoned, and a continuation-in-part of application No. 14/472,869, filed on Aug. 29, 2014, which is a continuation of application No. 13/464,433, filed on May 4, 2012, now Pat. No. 8,839,073.

(51) Int. Cl.
| | |
|---|---|
| *G11C 11/56* | (2006.01) |
| *G11C 16/26* | (2006.01) |
| *G11C 16/34* | (2006.01) |

(52) U.S. Cl.
CPC ......... *G11C 11/5642* (2013.01); *G11C 16/26* (2013.01); *G11C 16/3418* (2013.01); *G11C 16/3454* (2013.01)

(58) Field of Classification Search
None
See application file for complete search history.

(56) References Cited

U.S. PATENT DOCUMENTS

| | | | | |
|---|---|---|---|---|
| 8,000,135 | B1* | 8/2011 | Perlmutter | G11C 11/5642 365/185.03 |
| 8,345,477 | B1* | 1/2013 | Yang | G11C 11/5628 365/185.03 |

(Continued)

OTHER PUBLICATIONS

Office Action Translation, Taiwan Application No. 102122792, May 8, 2015, 7 pages.

(Continued)

*Primary Examiner* — James G Norman
(74) *Attorney, Agent, or Firm* — Cesari & Reed, LLP; Kirk A. Cesari

(57) ABSTRACT

An SSD controller dynamically adjust read thresholds in a NVM to reduce errors due to device threshold voltage distribution shifts, thus improving performance, reliability, and/or cost of a storage sub-system, such as an SSD. In a first aspect, the controller periodically performs offline tracking on a portion of the NVM. The controller reads a representative sub-portion with current read thresholds. If the read meets a condition, then the controller reads the sub-portion with sample read thresholds, estimates the device threshold voltage distributions, and adjusts the current read thresholds of the portion to calculated new operating read thresholds of the sub-portion. In a second aspect, the portion includes data with a known statistical average number of zero and/or one bits.

20 Claims, 8 Drawing Sheets

(56) References Cited

U.S. PATENT DOCUMENTS

| | | | |
|---|---|---|---|
| 2008/0263265 A1* | 10/2008 | Litsyn | G11C 11/5628 |
| | | | 711/103 |
| 2009/0282186 A1* | 11/2009 | Mokhlesi | G11C 11/5642 |
| | | | 711/103 |
| 2010/0091535 A1 | 4/2010 | Sommer | |
| 2011/0182119 A1* | 7/2011 | Strasser | G11C 16/28 |
| | | | 365/185.03 |

OTHER PUBLICATIONS

Taiwan Search Report, Taiwan Application No. 102122792, May 6, 2015, 1 page.

* cited by examiner

OPTIMIZATION OF READ THRESHOLDS FOR NON-VOLATILE MEMORY

CROSS REFERENCE TO RELATED APPLICATIONS

The present application is a continuation of and claims priority to pending U.S. patent application Ser. No. 13/533,130, filed Jun. 26, 2012, entitled "Fast Tracking For Flash Channels", and is a continuation-in-part of and claims priority to U.S. patent application Ser. No. 14/472,869, filed Aug. 29, 2014, entitled "ZERO-ONE BALANCE MANAGEMENT IN A SOLID-STATE DISK CONTROLLER", which was a continuation of U.S. patent application Ser. No. 13/464,433, filed May 4, 2012, entitled "ZERO-ONE BALANCE MANAGEMENT IN A SOLID-STATE DISK CONTROLLER", the contents of all are hereby incorporated by reference in their entireties.

BACKGROUND

Field

Advancements in non-volatile storage technology are needed to provide improvements in performance, efficiency, and utility of use.

Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

Various aspects of flash memory as used by Solid State Disk (SSD) controllers will now be described in part to establish a technology background and in part to establish antecedents for nomenclature used in the balance of the specification. The minimal size of data readable by the SSD controller from Non-Volatile Memory (NVM) is a "read unit" that is protected by included error correction, such as a Low-Density Parity-Check (LDPC) code. In some contexts, a read unit is referred to as a "codeword". In some embodiments, each read unit contains approximately 4 K to approximately 32 K bits of user data, plus error correction overhead. Under command of the SSD controller, those bits are read from NVM memory cells (e.g. via an array access of one or more portions of the NVM memory cells), which depending on the technology as discussed below, may hold one or more bits per cell. In some embodiments, for security reasons an SSD controller encrypts the data prior to writing the data to NVM. In some embodiments, in view of circuit design limitations with respect to long strings of identically programmed cells, an SSD controller scrambles the data prior to writing the data to NVM.

Considered individually, each cell has a particular stored (programmed) charge that corresponds to a device threshold voltage for that cell, and further corresponds to the logical bit values being stored in the cell. While ideally all of the cells in the NVM would have identical device threshold voltages for the logical bit values stored, in practice for a variety of reasons the device threshold voltages differ across the cells in probability distributions along the device threshold voltage axis (e.g., "device threshold voltage distributions") that are similar to a Gaussian in shape.

Thus considered in aggregate across a large number of cells, such as of a read unit, there are as may device threshold voltage distributions (e.g., Gaussian probability curves) as there are states per cell (two states per bit of storage per cell). That is, for N-bits per cell of storage, there are $2^{}N$ states and the same number of device threshold voltage distributions. Generally, $(2^{}N)-1$ different read thresholds (read voltage references $V_{READ1}$ through $V_{READ(N-1)}$) are required by read circuits in the NVM to distinguish between the $2^{**}N$ states.

Continuing from above, for Single-Level Cell (SLC) flash memories, $N=1$. SLC memories thus store one-bit per cell of storage, have two device threshold voltage distributions (one for zeroes and another for ones), and require a single read threshold, read voltage reference $V_{READ1}$. From lower to higher device threshold voltages, the two device threshold voltage distributions are known as the E (Erased) state and D1 (first Data) state. While arbitrary, a common mapping (coding) is to assign logical one to the E state and logical zero to the D1 state. Thus references to zeroes and ones are proxy references for respective decodings of the D1 state and the E state.

Continuing further from above, for Multi-Level Cell (MLC) flash memories, $N>1$. MLC memories thus store more than one bit per cell, have more than two device threshold voltage distributions, and require multiple different read thresholds to distinguish the distributions. For example, a 4LC memory (e.g. flash memory) stores two bits per cell, has four device threshold voltage distributions, and generally requires three read thresholds (read voltage references $V_{READ1}$, $V_{READ2}$, and $V_{READ3}$). From lower to higher device threshold voltages, the four device threshold voltage distributions are known as the E (Erased), D1 (Data1), D2 (Data2), and D3 (Data3) states. While arbitrary, each of the four device threshold voltage distributions is also mapped (addressed) in accordance with a particular binary sequence, such as a Gray code sequence. Thus references to one or more of the 11, 10, 00, and 01 states, are proxy references for respective decodings of the E, D1, D2, and D3 states.

With respect to address mapping used for the states of an MLC, each can be said to have a Most Significant Bit (MSB) and a Least Significant Bit (LSB) (and for more than two bits per cell, bits of significance in between). While there are various ways that MLC NVMs programs their cells, the following approach is common. An initial programming round (a manipulation of the charge distributions) establishes the LSB, e.g., writes the "lower pages". This is done loosely in the same manner as for writing an SLC, e.g., a charge manipulation that establishes the E state device threshold voltage distribution and a second state device threshold voltage distribution. Depending on the binary sequence used, the second state device threshold voltage distribution is similar to the D1 state device threshold voltage distribution, similar to the D2 state device threshold voltage distribution, or between the D1 and D2 state device threshold voltage distributions. For MLC, one or more additional programming rounds further manipulate the device threshold, voltage distributions (in number, location along the device threshold voltage axis, and in shape), as required per the number of levels of the MLC. More particularly, one or more subsequent programming operations write the "middles pages" (if any, for more than two bits per cell), and a last programming operation establishes the MSB, e.g., writes the "upper pages". For example in a 4LC (2-bit per cell MLC), the E distribution and the second distribution of the first program round are respectively bifurcated by a second program round into E and D1 distributions and D2 and D3 distributions.

The device threshold voltage distributions are modified away from their initial/nominal distributions by one or more factors, such as read disturb, write disturb, and retention loss. More particularly, over time, temperature, and other factors related to use, the location of each of the device threshold voltage distribution can move around with respect to the device threshold voltage axis. Such changes increase the likelihood of read errors that are performed using a read reference voltage value for the read threshold that was previously established based on the nominal device threshold voltage distribution. In some SLC embodiments, when a hard-decision uncorrectable error is encountered in a read unit read from NVM, a series of retry operations is performed to recover the read unit. The retry operations include the controller re-reading the read unit at different voltage values of the read threshold $V_{READ1}$, such as determined by a register setting written via an I/O command from the SSD controller. By reading at different settings of the read threshold $V_{READ1}$, the read unit is sampled at different points on the device threshold voltage axis in an attempt to locate a sample of the read unit that is (hard-decision) correctable.

One algorithm suggested by NVM vendors is sweeping the SLC read threshold slowly upwards (increasing the read reference voltage $V_{READ3}$, from its nominal value) in an attempt to find a sample of the read unit that is correctable. If this procedure fails, then the read threshold is swept in another direction (decreasing the read reference voltage $V_{READ1}$ from its nominal value). If both sweeps fail, then the read unity is uncorrectable (by hard-decision decoding). Linearly sweeping the read threshold, which might have 16 to 64 steps at different respective read reference voltage settings, requires many time-consuming samples of the read unit (each with an attendant recovery time latency). Even when such a search is infrequently required, and thus not a major impact on average latencies, for applications with strict maximum latency requirements, including some database applications, such as time-consuming search is unacceptable.

SYNOPSIS

The invention may be implemented in numerous ways, including as a process, an article of manufacture, an apparatus, a system, a composition of matter, and a computer readable medium such as a computer readable storage medium (e.g., media in an optical and/or magnetic mass storage device such as a disk, or an integrated circuit having non-volatile storage such as flash storage) or a computer network wherein program instructions are sent over optical or electronic communication links. In this specification, these implementations, or any other form that the invention may take, may be referred to as techniques. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Example Embodiments of one or more of systems, methods, articles of manufacture, and computer readable media in accordance with the concepts described herein. As is discussed in more detail in the Conclusions, the invention encompasses all possible modifications and variations within the scope of the issued claims.

The inventors believe they are the first to note the significance, with respect to read threshold management and attendant low latency performance and extended lifetime benefits, of the scrambling of data written to NVM and the tracking and managing of the statistical distribution of state of the scrambled data. More particularly, the inventors believe they are the first to note that a disparity in the statistical distributions of state of data read vs. data written is indicative of a shift in a preferred read threshold to use for reading the NVM. In some embodiments, an SSD controller scrambles data, such as via encryption, prior to writing the data to NVM. The scrambled data has a known zero/one balance (statistical distribution of bits stored as zeroes and ones), such as having close to a 50-50 balance of zero bits and one bits. With efficient scrambling, the data is effectively random. In a random sample the size of an NVM read unit, a distribution of zeroes and ones tends to be very tight (narrowly dispersed about the mean). For example, with 16 K (16,384) random bits, a probability of either the zeroes count or the ones count being more than approximately 300 away from a mean (8 K) in either direction is <1% (and a probability of being more than approximately 500 away in either direction is <1 in a million).

Shifts in the various device threshold voltage distributions with respect to the device threshold voltage axis (due to any number of factors), away from a nominal distribution, act to change the location of a center-point between the device threshold voltage distribution peaks. Changes in this actual "threshold voltage center-point" without corresponding tracking adjustments to the corresponding read threshold are a cause for read errors. The inventors believe they are the first to note significance of this change of center point, with respect to read threshold management and attendant low latency performance and extended lifetime benefits.

Exploiting the above observations, in some embodiments an SSD controller at least temporarily maintains a zero count and a one count for each read unit read from an SLC NVM (or the lower pages of an MLC). In the event that the read unit is uncorrectable (e.g. in a context of hard-decision decoding) in part due to the shift in the device threshold voltage distributions away from their (initial) nominal distributions, the zero count and/or the one count enable a determination of a direction and/or a magnitude to move a read threshold (read voltage reference $V_{READ1}$) to track the shifted (a.k.a. adjusted) device threshold voltage distributions and restore the zero/one balance. As presented in the Detailed Description, according to embodiment, the new voltage setting for the read threshold is determined in a variety of ways (counts, percentages) based on a number of factors (e.g. observed/inferred device threshold voltage distributions, known stored values, and past NVM operating events).

In some embodiments and/or usage scenarios, read thresholds are adjusted independently of detection of uncorrectable (e.g. hard-decision decode) errors, such as via an offline tracking technique that proactively manages read thresholds. The independent adjustment of read thresholds enables, in some contexts, avoiding uncorrectable errors that would otherwise occur without the independent adjustment. In various embodiments, a read threshold adjustment of the NVM is determined any one or more of: at manufacture of the NVM, at initial use of the NVM (e.g. a first SSD boot), at one or more times (e.g. periodically, irregularly, or randomly), in response to a bit error rate that is above a threshold, and in response to meeting a condition (e.g. exceeding a target BER, or exceeding a target disparity in the zero/one balance). In various embodiments, blocks of the NVM are managed in groups, and each of the sampling of the blocks of a particular one of the managed groups is at least partially read. If at least some of the partial read sample blocks meet the condition, then the read threshold is adjusted for all of the blocks of the particular managed group. In various embodiments, the adjusting is via estimating device threshold voltage distributions using techniques applicable to Gaussian distributions.

Some of the above techniques are extended for MLC memories, including maintaining counts for upper pages and shifting of multiple read thresholds. Some of the above techniques are also usable with a variety of encryption/scrambling methods having known zero/one balances other than a 50-50 balance.

BRIEF DESCRIPTION OF DRAWINGS

FIGS. 2A and 2B are SLC specific, respectively illustrating device threshold voltage distributions at a first and a later second time. FIGS. 2C and 2D are MLC specific, respectively illustrating device threshold voltage distributions at a first and a later second time.

List of Reference Symbols in Drawings

Figure 1A:
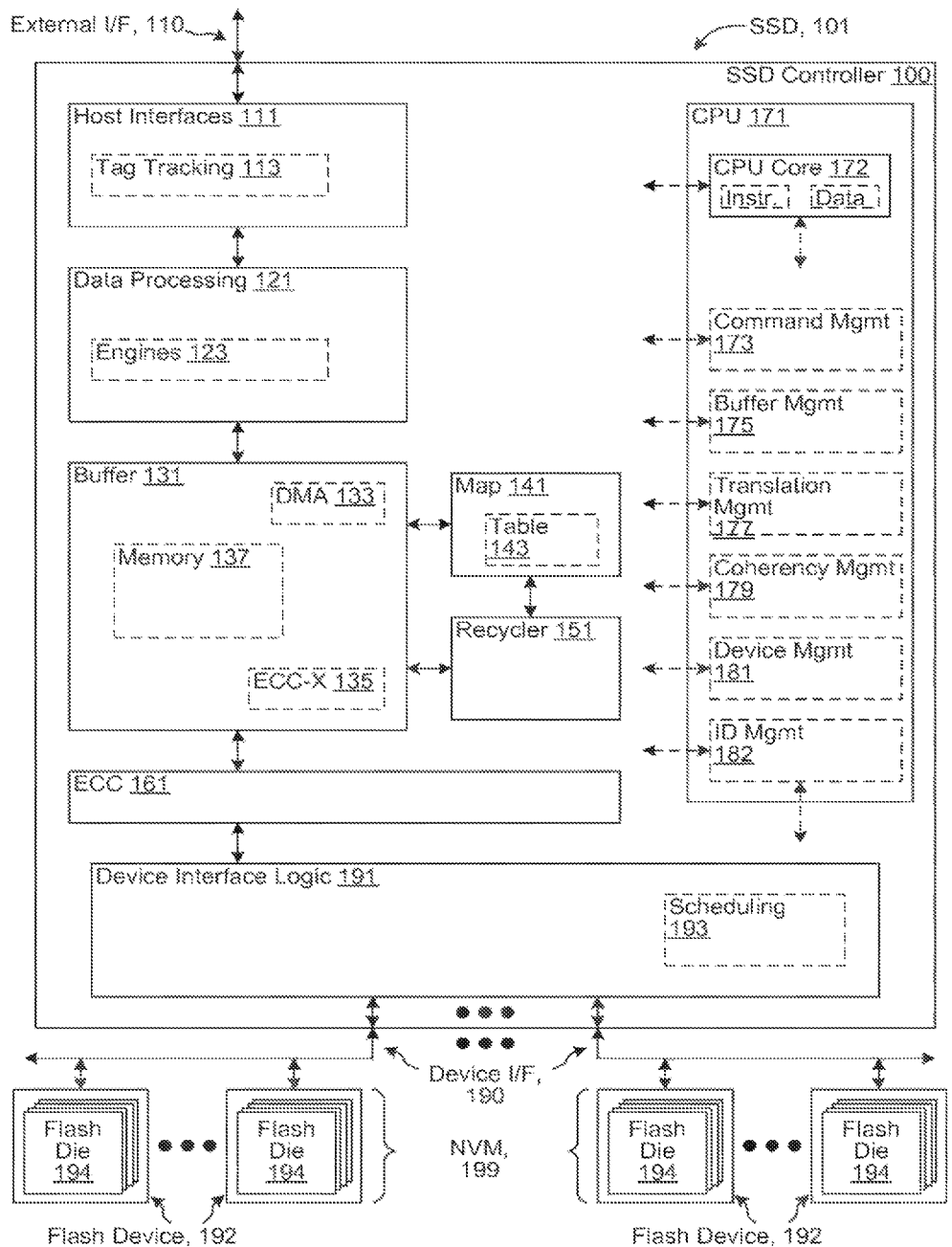
FIG. 1A illustrates selected details of an embodiment of a Solid-State Disk (SSD) including an SSD controller that implements optimization of read thresholds for managing Non-Volatile Memory (NVM) elements (e.g., flash memories).

| Ref. Symbol | Element Name |
|---|---|
| 100 | SSD Controller |
| 101 | SSD |
| 102 | Host |
| 103 | (optional) Switch/Fabric/Intermediate Controller |
| 104 | Intermediate Interfaces |
| 105 | OS |
| 106 | FirmWare (FW) |
| 107 | Driver |
| 107D | dotted-arrow (Host Software ←→ I/O Device Communication) |
| 109 | Application |
| 109D | dotted-arrow (Application ←→ I/O Device Communication via driver) |

-continued

List of Reference Symbols in Drawings

| Ref. Symbol | Element Name |
|---|---|
| 109V | dotted-arrow (Application ←→ I/O Device Communication via VF) |
| 110 | External Interfaces |
| 111 | Host Interfaces |
| 112C | (optional) Card Memory |
| 113 | Tag Tracking |
| 114 | Multi-Device Management Software |
| 115 | Host Software |
| 116 | I/O Card |
| 117 | I/O & Storage Devices/Resources |
| 118 | Servers |
| 119 | LAN/WAN |
| 121 | Data Processing |
| 123 | Engines |
| 131 | Buffer |
| 133 | DMA |
| 135 | ECC-X |
| 137 | Memory |
| 141 | Map |
| 143 | Table |
| 151 | Recycler |
| 161 | ECC |
| 171 | CPU |
| 172 | CPU Core |
| 173 | Command Management |
| 175 | Buffer Management |
| 177 | Translation Management |
| 179 | Coherency Management |
| 180 | Memory Interface |
| 181 | Device Management |
| 182 | Identity Management |
| 190 | Device Interfaces |
| 191 | Device Interface Logic |
| 192 | Flash Device |
| 193 | Scheduling |
| 194 | Flash Die |
| 199 | NVM |
| 210 | SLC Nominal Read Threshold |
| 215 | SLC Adjusted Read Threshold |
| 220 | SLC Nominal Most-Negative Threshold State |
| 225 | SLC Adjusted Most-Negative Threshold State |
| 230 | SLC Nominal Most-Positive Threshold State |
| 235 | SLC Adjusted Most-Positive Threshold State |
| 240 | MLC Nominal First Read Threshold |
| 242 | MLC Nominal Second Read Threshold |
| 244 | MLC Nominal Third Read Threshold |
| 250 | MLC Nominal Most-Negative Threshold State |
| 251 | MLC Adjusted Most-Negative Threshold State |
| 260 | MLC Nominal Next-Most-Negative Threshold State |
| 261 | MLC Adjusted Next-Most-Negative Threshold State |
| 265 | MLC Adjusted First Read Threshold |
| 270 | MLC Nominal Next-Most-Positive Threshold State |
| 271 | MLC Adjusted Next-Most-Positive Threshold State |
| 275 | MLC Adjusted Second Read Threshold |
| 280 | MLC Nominal Most-Positive Threshold State |
| 281 | MLC Adjusted Most-Positive Threshold State |
| 285 | MLC Adjusted Third Read Threshold |
| 306 | Write Data |
| 310 | Scrambler |
| 311 | Scrambled Write Data |
| 320 | ECC Encoder |
| 321 | ECC Encoded Write Data |
| 332 | NVM Array |
| 334 | Programmable Read Voltage Circuitry |
| 336 | Control/Status Registers |
| 338 | I/O |
| 340 | Imbalance Detector |
| 341 | Imbalance |
| 351 | Read Data |
| 359 | Uncorrected & Scrambled (Raw) Read Data |
| 360 | ECC Decoder |
| 361 | Corrected Read Data |
| 362 | Uncorrectable Read |
| 370 | Descrambler |

List of Reference Symbols in Drawings (continued)

| Ref. Symbol | Element Name |
|---|---|
| 371 | Unscrambled Read Data |
| 380 | Balance Restoration Logic |
| 410 | Scramble Data |
| 420 | ECC Encode |
| 430 | Write NVM |
| 440 | Read NVM |
| 450 | Data Recovery |
| 460 | Uncorrectable Error Evaluation |
| 470 | Disparity Determination |
| 480 | Read Threshold Adjustment |
| 510 | Initialize Current Read Thresholds to Default Operating Read Thresholds |
| 520 | Read With Current Read Thresholds |
| 530 | Update Current Read Thresholds |
| 540 | Offline Tracking |
| 541 | Read Random Blocks with Current Read Thresholds |
| 542 | Meets Condition? |
| 543 | Read With Sample Read Thresholds |
| 544 | Estimate New Device Threshold Voltage Distributions |
| 545 | Calculate New Operating Read Thresholds |
| 546 | Update Current Read Thresholds With New Operating Read Thresholds |
| 550 | Timer Expired? |
| 600 | MLC Old Most-Negative Threshold State |
| 601 | MLC Old Next-Most-Negative Threshold State |
| 602 | MLC Old Next-Most-Positive Threshold State |
| 603 | MLC Old Most-Positive Threshold State |
| 610 | MLC Old First Read Threshold |
| 611 | MLC Old Second Read Threshold |
| 612 | MLC Old Third Read Threshold |
| 620 | MLC New Most-Negative Threshold State |
| 621 | MLC New Next-Most-Negative Threshold State |
| 622 | MLC New Next-Most-Positive Threshold State |
| 623 | MLC New Most-Positive Threshold State |
| 630 | First of First Set of LSB Sample Read Thresholds |
| 631 | Second of First Set of LSB Sample Read Thresholds |
| 632 | Third of First Set of LSB Sample Read Thresholds |
| 640 | First of Second Set of LSB Sample Read Thresholds |
| 641 | Second of Second Set of LSB Sample Read Thresholds |
| 642 | Third of Second Set of LSB Sample Read Thresholds |
| 650 | MLC New First Read Threshold |
| 651 | MLC New Second Read Threshold |
| 652 | MLC New Third Read Threshold |

DETAILED DESCRIPTION

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not necessarily obscured.

INTRODUCTION

This introduction is included only to facilitate the more rapid understanding of the Detailed Description; the invention is not limited to the concepts presented in the introduction (including explicitly examples, if any), as the paragraphs of any introduction are necessarily an abridged view of the entire subject and are not meant to be an exhaustive or restrictive description. For example, the introduction that follows provides overview information limited by the space and organization to only certain embodiments. There are many other embodiments, including those to which claims will ultimately be drawn, discussed throughout the balance of the specification.

ACRONYMS

At least some of the various shorthand abbreviations (e.g. acronyms) defined here refer to certain elements used herein.

| Acronym | Description |
|---|---|
| AES | Advanced Encryption Standard |
| AHCI | Advanced Host Controller Interface |
| API | Application Program Interface |
| ASCII | American Standard Code for Information Interchange |
| ATA | Advanced Technology Attachment (AT Attachment) |
| BCH | Bose Chaudhuri Hocquenghem |
| BER | Bit Error Rate |
| CD | Compact Disk |
| CF | Compact Flash |
| CMOS | Complementary Metal Oxide Semiconductor |
| CPU | Central Processing Unit |
| CRC | Cyclic Redundancy Check |
| DAS | Direct Attached Storage |
| DDR | Double-Data-Rate |
| DES | Data Encryption Standard |
| DMA | Direct Memory Access |
| DNA | Direct NAND Access |
| DRAM | Dynamic Random Access Memory |
| DVD | Digital Versatile/Video Disk |
| DVR | Digital Video Recorder |
| ECC | Error-Correcting Code |
| eMMC | Embedded MultiMediaCard |
| eSATA | external Serial Advanced Technology Attachment |
| GPS | Global Positioning System |
| HDD | Hard Disk Drive |
| I/O | Input/Output |
| IC | Integrated Circuit |
| IDE | Integrated Drive Electronics |
| JPEG | Joint Photographic Experts Group |
| LAN | Local Area Network |
| LB | Logical Block |
| LBA | Logical Block Address |
| LDPC | Low-Density Parity-Check |
| LFSR | Linear Feedback Shift Register |
| LPN | Logical Page Number |
| LSB | Least Significant Bit |
| LZ | Lempel-Ziv |
| MLC | Multi-Level Cell |
| MMC | MultiMediaCard |
| MPEG | Moving Picture Experts Group |
| MSB | Most Significant Bit |
| NAS | Network Attached Storage |

-continued

| Acronym | Description |
| --- | --- |
| NCQ | Native Command Queuing |
| NVM | Non-Volatile Memory |
| ONA | Optimized NAND Access |
| ONFI | Open NAND Flash Interface |
| OS | Operating System |
| PC | Personal Computer |
| PCIe | Peripheral Component Interconnect express (PCI express) |
| PDA | Personal Digital Assistant |
| PHY | PHYsical interface |
| POS | Point Of Sale |
| RAID | Redundant Array of Inexpensive/Independent Disks |
| RASIE | Redundant Array of Silicon Independent Elements |
| ReRAM | Resistive Random Access Memory |
| RS | Reed-Solomon |
| RSA | Rivest, Shamir & Adleman |
| SAN | Storage Attached Network |
| SAS | Serial Attached Small Computer System Interface (Serial SCSI) |
| SATA | Serial Advanced Technology Attachment (Serial ATA) |
| SCSI | Small Computer System Interface |
| SD | Secure Digital |
| SDR | Single-Data-Rate |
| SLC | Single-Level Cell |
| SMART | Self-Monitoring Analysis and Reporting Technology |
| SSD | Solid-State Disk/Drive |
| TCG | Trusted Computing Group |
| UFS | Unified Flash Storage |
| USB | Universal Serial Bus |
| VF | Virtual Function |
| WAN | Wide Area Network |

Tracking and Restoring Zero/One Balances

The initial discussion that follows, of tracking an managing counts for zeroes and ones and the shifting of the read threshold used to distinguish the zero and one states, is directly applicable to SLC memories and (without minor variation, as noted) to the lower pages of MLC memories. More generally with respect to MLC memories, extension to tracking and managing counts for upper pages and the shifting of multiple read thresholds (e.g., read voltage references $V_{READ1}$, $V_{READ2}$, and $V_{READ3}$) is detailed in separate paragraphs below.

In some embodiments, a zero count and a one count are obtained for each read unit (or each group of read units transferred at one time from one NVM die) read from an SLC NVM. In an event that the read unit is uncorrectable (e.g. in a context of hard-decision decoding) in part due to the shift in the device threshold voltage distributions away from their (initial) nominal distributions, the zero count and/or the one count enable a determination of a direction and/or a magnitude to move (set) a read threshold to track the shift in the device threshold voltage distributions and restore the zero/one balance. The read threshold being adjusted is read voltage reference $V_{READ1}$ for SLC memories and read voltage reference $V_{READ2}$ for the lower pages of MLC memories. For example, in an SLC having a logical one assigned to the erase state, and written with a known statistically equal (50-50 percent, a.k.a. 50/50 percent, or simply 50/50) distribution of zeroes and ones, if a current zero/one counts indicates a predominance of ones, $V_{READ1}$ is shifted lower; and if the current zero/one counts indicates a predominance of zeroes, $V_{READ1}$ is shifted higher. (Substitute $V_{READ2}$ for $V_{READ1}$ in the foregoing example, for the lower pages of MLC memories.) A magnitude of how much to change (shift) the read threshold is optionally determined by a percentage of a number of zeroes (or ones). The magnitude is based on one or more of: the number of zeroes and/or ones observed in one or more samples; a read threshold increment of the one or more samples; a knowledge of predicted device threshold voltage distributions corresponding to a midpoint between the peaks of the two distributions: program/erase count (wear); read disturb counts; retention time; and other similar factors.

Finding the Read-Equilibrium Point

In further embodiments, a binary-search-like operation (iteratively sampling the same read unit at respective values of the appropriate read voltage reference) is used to find a read threshold "read-equilibrium point". This is a point on the device threshold voltage axis between adjacent device threshold voltage distributions resulting in raw data (pre error correction) statistical state distributions that upon reading, match within statistical margin of error to the statistical state distributions written, or idealized models of same.

For SLC memory and random scrambling, such as resulting from encryption, the read-equilibrium point is the read threshold (read voltage reference $V_{READ1}$) where a zero/one balance (of the raw data read from the NVM) is most even (near identical). Under such conditions, the two state distributions have a 50-50 balance. I.e., 50% of the states read are zeroes and 50% of the states read are ones. (Substitute $V_{READ2}$ for $V_{READ1}$ in the foregoing for the lower pages of MLC memories).

In some embodiments, the read-equilibrium point corresponds to one or more of: a center point between two voltage distributions, a minima between two voltage distributions, a point at which the zero/one balance in read data is closest to 50-50, and a point determined according to interpolation of the zero/one balance found at two other points. The read equilibrium point corresponds to a center-point between the adjacent device threshold voltage distributions in embodiments having symmetric adjacent device threshold voltage distributions.

Finding and setting the read threshold to the desired read-equilibrium point reduces the number of reads required to find an optimal point at which to attempt hard-decision decoding. In still further embodiments, hard-decision decoding is attempted at each read threshold sampling point (each value of $V_{READ1}$ for SLC memories, or each value of $V_{READ2}$ for the lower pages of MLC memories) in the binary search in the event a "good enough" read threshold is found before the read threshold read-equilibrium point is found. The search is generally truncated upon finding the good enough read threshold, except as discussed below regarding possibly taking additional sampling around the determined read-equilibrium point for soft-decision decoding purposes. In various embodiments, the "good enough" read threshold results in success hard decision decoding of the raw read data. In some embodiments, a magnitude of the search steps (the read threshold increment) in the binary search is determined (based), at least in part, on various factors as detailed above regarding the magnitude of the read threshold change.

MLC Considerations

In MLC memories, multiple read thresholds are managed. In some embodiments, this is performed by assuming uniform displacements of the multiple device-threshold-voltage distributions and changing all other read thresholds based on decisions made for the first read threshold ($V_{READ1}$) based on the read data zero/one balance of the lower pages.

For a 4LC NVM, theoretically there is an 11/10/00/01 balance of 25-25-25-25 (in contrast to a zero/one balance of 50-50). However, there is no single operation that directly provides this balance, given that 4LCs are generally read via separate array accesses using the three read voltage references: $V_{READ2}$ for lower pages and $V_{READ1}$ and $V_{READ3}$ for upper pages. One could thus evaluate two respective zero/one balance: between the D1 and D2 states for lower pages, and between the E and D1 states combined with between the D2 and D3 states for upper pages. Alternatively, one could carry out three separate lower-page-like array accesses setting the single lower-page read threshold to values near each of $V_{READ1}$, $V_{READ2}$, and $V_{READ3}$.

By way of example, in some 4LC NVM embodiments, read voltage references $V_{READ1}$, $V_{READ2}$, and $V_{READ3}$ may need shifting, at least for one of the two bits stored in the cell. Working similarly to the SLC case, one of the two bits stored in the cell requires a single array access at a first read threshold ($V_{READ2}$, in this MLC case). Ascertaining the other bit requires two additional read thresholds ($V_{READ1}$ and $V_{READ3}$, and effectively two associated respective additional array accesses that are performed internally by the NVM).

According to various embodiments, either: the two read thresholds ($V_{READ1}$ and $V_{READ3}$) for the other bit are moved in unison by a same and/or a differing amount (under a presumption that drift is similar for both states); or the two read thresholds for the other bit are moved independently (at a cost in additional read operations). The latter options requires knowing the state of the SLC-like bit in the cell (the LSB), as the state of the SLC-like bit determines which of the two read thresholds ($V_{READ1}$ and $V_{READ3}$) are used for ascertaining the corresponding other bit (the MSB).

In some 4LC embodiments, a combined "upper page" read data zero/one balance is evaluated for a simultaneous blend of the E and D1 distributions and the D2 and D3 distributions. Based on disparities in the combined zero/one balance read vs. that written, and in view of the bit sense reversal (1 to 0 for moving from E to D1, and 0 to 1 for moving from D2 to D3), the corresponding two read thresholds ($V_{READ1}$ and $V_{READ3}$) are moved in unison in opposite directions. This is done such that the zero/one balance of each component of the blend moves "in the same direction" (e.g., the movements do not conflict).

In some 4LC embodiments, the movement of the two upper page read thresholds ($V_{READ1}$ and $V_{READ3}$) are separately determined by respective evaluations of zero/one balance for the upper page while using a respective LSB for each bit of the read unit. When the LSB=1, the direction of movement is the opposite of that of the LSB=0 case. For example, instead of computing a disparity between a zero count and a none count in upper page read data, an upper page disparity is computed by selectively modifying each bit of upper page read data based on a corresponding bit of lower page read data, converting a sense of the bits of the upper page read data from a numeric value to a directional value where, for example, 0 represents a higher device threshold voltage and 1 represents a lower device threshold voltage. In some embodiments, an XNOR of the bits of the upper page read data and the corresponding bits of the lower page read data performs the converting.

Removing Bias from Soft-Decision Samples

In some embodiments, soft decision information is obtained from NVM to perform soft-decision based decoding. The soft decision information is obtained by reading a read unit (or each group of read units transferred at one time from one NVM die) at a variety of read threshold sampling points (for an SLC, values of $V_{READ1}$) about the nominal (unadjusted) read threshold to obtain multiple samples of data of the read unit, thus building up a soft-decision likelihood of a value of each bit of the read unit. A spacing of the samples depends, at least in part, on particular properties of the NVM used, such as its nominal separation of charge states.

The soft-decision information is biased, however, unless the nominal read threshold about which the samples are taken is a read threshold read-equilibrium point (as described above). If the current read threshold is not the threshold read-equilibrium point, then all the soft-decision information is biased in one direction or the other. Following are two example techniques to adjust for this and obtain unbiased (or at least less-biased) soft-decision information:

1. Since a zero/one balance of the read unit as sample at each of the read threshold sampling points is readily identified, the read threshold read-equilibrium point is readily determined (according to embodiment, such as by using linear interpolation). An offset is calculated corresponding to the difference between the determine read threshold read-equilibrium point and the (old, unadjusted) nominal read threshold. Previously determined soft-decision information is enabled to be properly "re-centered" and still used by applying the offset with respect to the voltages at which the soft-decision information was previously sampled (with values larger than 1.0 or less than 0.0 being truncated). This approach requires no additional reads, but produces a differing amount of precision/accuracy for some of the data.

2. Since a zero/one balance of the read unit as sampled at each of the read threshold sampling points is readily identified, after collecting all required samples, the read threshold sampling point closest to the read threshold read-equilibrium point is readily determined. The closest is the read threshold sampling point with the zero/one balance most proximate to the zero/one balance written. For the SLC encryption (or scrambling) case, it is the read threshold sampling point closest to having a 50-50 balance. As all of the sample nominally have equivalents spacing from each other, the closest sample is chosen as a new nominal read threshold, and additional soft-decision information samples are optionally gathered (assuming the new nominal read threshold differs from the old). Alternatively, a binary search to find the threshold read-equilibrium point is done first, with precision of the binary search limited to a finest granularity of sampling required for the desired precision of the soft-decision information. The desired precision of the soft-decision information has an associated sample window around the new nominal read threshold. Doing a binary search as a part of multiple reads needed to obtain soft-decision information requires no additional reads, unless the old nominal read threshold falls outside the desired precision sample window.

In the SLC encryption embodiments described so far, the above techniques have focused on finding a preferred read threshold that yields a read data zero/one balance that is closest to 50-50. For cases where the device threshold voltage distributions are of generally the same symmetric shape and do not substantially overlap, this preferred read threshold would also correspond to the minima of the combined device threshold voltage distributions.

Read Threshold Interpolated from Known Points on the Device Threshold Voltage Distributions In some embodiments, another approach to finding the preferred read threshold is to instead find two points, one on each adjacent device threshold voltage distribution, and determine the midpoint between these two points by interpolation. For example, sampling at the peak of each device threshold voltage distribution should yield a 75/25 balance of read data zeroes/ones (or ones/zeroes, depending on which peak). Once the two peaks are identified, the calculated midpoint between the two on the device threshold voltage axis is used to set a new read threshold.

If it is known a priori that the device threshold voltage distributions are not uniform (e.g., asymmetrically biased on one side or the other, such as by having a long tail), then in some embodiments that information is used to interpret the position of the peak and to locate the center by a slightly more complex interpolation (e.g., not just the midpoint). Factors such as retention time and/or wear may influence the symmetry of the device threshold voltage distributions and are accounted for in some embodiments. Multiple sampling points are also used in some embodiments to reveal the shape of the device threshold voltage distributions.

In some embodiments where the range of device threshold voltage adjustment is limited, it may not be possible to find the true peak. In particular, the device threshold voltage cannot be moved less than 0V with some flash devices even though the voltage distribution of the E state extends into negative device threshold voltages. Knowledge of the device threshold voltage distribution still permits the midpoint to be determined via interpolation. For example, if at 0V the read data zero/one balance is 60/40, then approximately 10% excess zeroes are being observed and an area of the E distribution to the right of 0V is approximately 10%. In a first approach of some embodiments, the peak of the D1 distribution is found, and the midpoint is interpolated based on knowledge of the approximate shape of the E distribution. In a second approach of some embodiments, the point of the D1 distribution at which the read data zero/one balance is 40/60 (the opposite point from the 0V measurement) is found. The calculated midpoint between the 60/40 and the 40/60 observations is then used to set the new preferred read threshold. The calculated midpoint could be determined with greater precision with additional knowledge and/or measurement of the two devices threshold voltage distributions.

In some embodiments, the points being interpolated are both on a same side as the read equilibrium point. For example, knowing that a first read threshold sampling point X yields 75/25 read data zero/one balance and a second read threshold sampling point Y yields 62.5/37.5, the read equilibrium point would be close to Y+/−(X−Y) where '+' vs. '−' depends on whether Y is less than X. The direction of the read equilibrium point is the direction corresponding to moving the read data zero/one balance closer to 50/50. In the example given, that is the direction from X and toward Y. Knowledge of the device threshold voltage distributions would yield a more accurate interpolation rather than the simple linear interpolation indicated.

Offline Tracking

In various embodiments and/or usage scenarios, the device threshold voltage distributions in an NVM shift over time and cause a read error (e.g. when hand-decision decoding). As the device threshold voltage distributions shift, values that were previously below (or above) a certain read threshold, fall above (or below) the certain read threshold and cause a bit error. E.g. a value previously stored as (and considered to be in) the D1 distribution, is determined to be in the D2 distribution, thus resulting in a bit error. A small number of bit errors are correctable; however a sufficient number of bit errors causes an uncorrectable (e.g. hard-decision decode) error. In some embodiments and/or usage scenarios, an uncorrectable (e.g. hard-decision decode) error that would otherwise occur is avoidable via proactive adjustment of read thresholds, such as via offline tracking that adjusts the read thresholds independently of uncorrectable error detection.

Example Embodiments

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims and their equivalents.

EC1) A method comprising:
  determining that a sub-portion, comprising scrambled data, of one or more portions of a Non-Volatile Memory (NVM) meets a condition when read in accordance with one or more old operating read thresholds; and
  adjusting the old operating read thresholds to respective new operating read thresholds in response to at least the determining.

EC2) A method comprising:
  scrambling data to be written to a portion of a Non-Volatile Memory (NVM) to produce scrambled data having a known statistical average number of zero bits and a known statistical average number of one bits;
  writing the scrambled data to the portion;
  reading, subsequent to the writing, the portion in accordance with one or more old operating read thresholds;
  determining that a sub-portion, comprising scrambled data, of one or more regions of a non-volatile memory (NVM) meets a condition when read in accordance with the old operating read thresholds; and
  adjusting the old operating read thresholds to respective new operating read thresholds in response to at least the determining.

EC3) A method comprising:
  reading a first portion of a Non-Volatile Memory (NVM) in accordance with sample read thresholds;
  estimating new device threshold voltage distributions, based at least in part on some results of the reading;
  calculating one or more new operating read thresholds, based at least in part on some of the estimated new device threshold voltage distributions; and
  performing one or more reads of a second portion of the NVM in accordance with the new operating read thresholds.

EC4) A method comprising:
  reading one or more representative portions of a managed group of portions of a Non-Volatile Memory (NVM);
  estimating new device threshold voltage distributions, based at least in part on some results of the reading;
  calculating one or more new operating read thresholds, based at least in part on some of the estimated new device threshold voltage distributions; and
  performing one or more reads of respective locations of the NVM in accordance with the new operating read thresholds.

EC5) A method comprising:
  selecting, from a managed group of portions of a Non-Volatile Memory (NVM), one ore more representative ones of the portions;

reading at least a respective sub-portion of each of the representative portions in accordance with respective old operating read thresholds;

determining that the reading of at least one of the respective sub-portions in accordance with the respective old operating read thresholds meets a condition;

reading the at least one of the respective sub-portions in accordance with sample read thresholds;

estimating new device threshold voltage distributions, based at least in part on some of results of the reading the at least one of the respective sub-portions in accordance with the sample read thresholds;

calculating one or more new operating read thresholds, based at least in part on some of the estimated new device threshold voltage distributions; and performing one or more reads of respective locations of the NVM in accordance with the new operating read thresholds.

EC6) The method of EC5, further comprising repeatedly performing any one or more of the selecting, the two acts of reading, the determining, the estimating, and the calculating.

EC7) The method of EC1, EC2 or EC5, wherein the condition is exceeding a target bit error rate.

EC8) The method of EC7, wherein the target bit error rate is configurable.

EC9) The method of EC7, wherein the target bit error rate is one half a correctable bit error rate.

EC10) The method of EC1, EC2 or EC5, wherein the condition is exceeding a target disparity between a number of zeroes and a number of ones for the reading performed in accordance with the old operating read thresholds.

EC11) The method of EC1 or EC2, wherein any one or more of the determining and the adjusting are performed in response to expiration of a configurable period.

EC12) The method of EC5, wherein any one or more of the selecting, the two acts of reading, the determining, the estimating, and the calculating are performed at least as frequently as a configurable period.

EC13) The method of EC11 or EC12, wherein the configurable period is one or more weeks.

EC14) The method of EC3, EC4, or EC5, wherein the estimated new device threshold voltage distributions are Gaussian distributions.

EC15) The method of EC3, EC4, or EC5, wherein the estimating estimates a respective mean and a respective standard deviation of each of the estimated new device threshold voltage distributions.

EC16) The method of EC3, EC4, or EC5, wherein the estimating is based at least in part on a Q-table.

EC17) The method of EC3, EC4, or EC5, wherein the new operating read thresholds are calculated based at least in part on one or more estimated means and/or standard deviations of the estimated new device threshold voltage distributions.

EC18) The method of EC3, wherein the first portion comprises scrambled data.

EC19) The method of EC3, wherein the first portion comprises any one of one or more read units, one or more pages, and one or more blocks of the NVM.

EC20) The method of EC18, wherein the second portion comprises scrambled data.

EC21) The method of EC18, wherein the first portion and second portion are a same portion.

EC22) The method of EC18, wherein the first portion and second portion are within a same block of the NVM.

EC23) The method of EC18, wherein the first portion contains at least a part of a first page of a particular one of a plurality of blocks of the NVM, and the second portion contains at least a part of a second page of the particular block, the second page being different from the first page.

EC24) The method of EC4 or EC5, wherein the portions of the managed group of portions share at least a determined characteristic.

EC25) The method of EC24, wherein the determined characteristic is based at least in part on any one or more of a number of program cycles, a number of erase cycles, a programming window, being a lower page, being an upper page, being an upper or a lower page, and being a middle page.

EC26) The method of EC4 or EC5, wherein the representative portions are selected randomly.

EC27) The method of EC4 or EC5, wherein the representative portions comprise one or more blocks.

EC28) The method of EC4 or EC5, wherein the one or more representative portions comprise scrambled data.

EC29) The method of EC4 or EC5, wherein each of the portions corresponds to one or more smallest units of erasing the NVM.

EC30) The method of EC4 or EC5, wherein at least one of the respective locations is within one of the representative portions.

EC31) The method of EC4 or EC5, wherein at least one of the respective locations is not within any of the representative portions.

EC32) The method of EC4, wherein the reading is in accordance with sample read thresholds.

EC33) The method of EC3, EC5, or EC32, wherein the sample read thresholds comprise a first set and a second set of Least Significant Bit (LSB) sample read thresholds.

EC34) The method of EC33, wherein the first set of LSB sample read thresholds is based at least in part on operating read thresholds in use before the reading.

EC35) The method of EC34, wherein the second of LSB sample read thresholds is based at least in part on a disparity between a number of zeroes and a number of ones for reads performed in accordance with the first set of LSB sample read thresholds.

EC36) The method of EC3, EC5, or EC32, wherein operating read thresholds in use before the reading comprise at least three previous operating read thresholds, and the sample read thresholds comprise at least a first set of two LSB sample read thresholds and a second set of two MSB sample read thresholds.

EC37) The method of EC5, wherein the at least the respective sub-portion of each of the representative portions comprises all sub-portions of each of the representative portions.

EC38) The method of EC5, wherein the respective sub-portions comprise scrambled data.

EC39) The method of EC1, EC2, EC3, EC4, or EC5, further comprising retrieving, in response to one or more requests from a host received via a host interface compatible with at least one storage interface standard, information from the NVM via reads in accordance with the new operating read thresholds.

EC40) The method of EC1, EC2, EC3, EC4, or EC5, further comprising communicating the new operating read thresholds to the NVM via a flash memory interface.

EC41) The method of EC1, EC2, EC3, EC4, or EC5, wherein the NVM comprises one or more flash memories.

EC42) Any of the foregoing ECs having or referring to a storage interface standard, wherein the storage interface standard comprises one or more of
a Universal Serial Bus (USB) interface standard,
a Compact Flash (CF) interface standard, a MultiMediaCard (MMC) interface standard,
an embedded MMC (eMMC) interface standard,
a Thunderbolt interface standard,
a UFS interface standard,
a Secure Digital (SD) interface standard,
a Memory Stick interface standard,
an xD-picture card interface standard,
an Integrated Drive Electronics (IDE) interface standard,
a Serial Advanced Technology Attachment (SATA) interface standard,
an external SATA (eSATA) interface standard,
a Small Computer System Interface (SCSI) interface standard,
a Serial Attached Small Computer System Interface (SAS) interface standard,
a Fibre Channel interface standard,
an Ethernet interface standard, and
a Peripheral Component Interconnect express (PCIe) interface standard.

EC43) Any of the foregoing ECs having or referring to a flash memory interface, wherein the flash memory interface is compatible with one or more of
an Open NAND Flash Interface (ONFI),
a Toggle-mode interface,
a Double-Data-Rate (DDR) synchronous interface,
a DDR2 synchronous interface;
a synchronous interface; and
an asynchronous interface.

EC44) Any of the foregoing ECs having or referring to a host, wherein the host comprises one or more of
a computer,
a workstation computer,
a server computer,
a storage server,
a Storage Attached Network (SAN),
a Network Attached Storage (NAS) device,
a Direct Attached Storage (DAS) device,
a storage appliance,
a Personal Computer (PC),
a laptop computer,
a notebook computer,
a netbook computer,
a tablet device or computer,
an ultrabook computer,
an electronic reading device (an e-reader),
a Personal Digital Assistant (PDA),
a navigation system,
a (handheld) Global Positioning System (GPS) device,
an automotive control system,
an automotive media control system or computer,
a printer, copier or fax machine or all-in-one device,
a Point Of Sale POS device,
a cash-register,
a media player,
a television,
a media recorder,
a Digital Video Recorder (DVR),
a digital camera,
a cellular handset,
a cordless telephone handset, and
an electronic game.

EC45) Any of the foregoing ECs having or referring to a at least one flash memory, wherein at least a portion of the at least one flash memory comprises one or more of
NAND flash technology storage cells, and
NOR flash technology storage cells.

EC46) Any of the foregoing ECs having or referring to a at least one flash memory, wherein at least a portion of the at least one flash memory comprises one or more of
Single-Level Cell (SLC) flash technology storage cells, and
Multi-Level Cell (MLC) flash technology storage cells.

EC47) Any of the foregoing ECs having or referring to a at least one flash memory, wherein at least a portion of the at least one flash memory comprises one or more of
polysilicon technology-based charge storage cells, and
silicon nitride technology-based charge storage cells.

EC48) Any of the foregoing ECs having or referring to a at least one flash memory, wherein at least a portion of the at least one flash memory comprises one or more of
two-dimensional technology-based flash memory technology, and
three-dimensional technology-based flash memory technology.

System

In some embodiments, an I/O device, such as an SSD, includes an SSD controller. The SSD controller acts as a bridge between the host interface and NVM of the SSD, and executed commands of a host protocol sent from a computing host via a host interface of the SSD. At least some of the commands direct the SSD to write and read the NVM with data sent from and to the computing host, respectively. In further embodiments, the SSD controller is enabled to use a map to translate between LBAs of the host protocol and physical storage addresses in the NVM. In further embodiments, at least a portion of the map is used for private storage (not visible to the computing host) of the I/O device. For example, a portion of the LBAs not accessible by the computing host is used by the I/O device to manage access to logs, statistics, or other private data.

In some embodiments, accessing compressed data of varying-sized quanta in NVM provides improved storage efficiency in some usage scenarios. For example, an SSD controller receives (uncompressed) data from a computing host (e.g., relating to a disk write command), compresses the data, and stores the compressed data into flash memory. In response to a subsequent request from the computing host (e.g., relating to a disk read command), the SSD controller reads the compressed data from the flash memory, uncompresses the compressed data, and provides the uncompressed data to the computing host. The compressed data is stored in the flash memory according to varying-sized quanta, the quanta size varying due to, e.g., compression algorithm, operating mode, and compression effectiveness on various data. The SSD controller uncompresses the data in part by consulting an included map table to determine where header(s) are stored in the flash memory. The SSD controller parses the header(s) obtained from the flash memory to determine where appropriate (compressed) data is stored in the flash memory. The SSD controller uncompresses the appropriate data from the flash memory to produce the uncompressed data to provide to the computing host. In the instant application, uncompress (and variants thereof) is synonymous with decompress (and variant thereof).

In various embodiments, an SSD controller includes a host interface for interfacing with a computing host, an interface for interfacing with NVM such as flash memory, and circuitry for controlling the interfaces and performing (and/or controlling various aspects of the performing) compressing and uncompressing, as well as lower-level error correction, higher-level error correction, and dynamic higher-level redundancy mode management with independent silicon elements.

According to various embodiments, some host interfaces are compatible with one or more of a USB interface standard, a CF interface standard, an MMC interface standard, an eMMC interface standard, a Thunderbolt interface standard, a UFS interface standard, an SD interface standard, a Memory Stick interface standard, an xD-picture card interface standard, an IDE interface standard, a SATA interface standard, a SCSI interface standard, a SAS interface standard, and a PCIe interface standard. According to various embodiments, the computing host is all or any portions of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game. In some embodiments, an interfacing host (such as an SAS/SATA bridge) operates as a computing host and/or as a bridge to a computing host.

In various embodiments, the SSD controller includes one or more processors. The processors execute firmware to control and/or perform operation of the SSD controller. The SSD controller communicates with the computing host to send and receive commands and/or status as well as data. The computing host executed one or more of an operating system, a driver, and an application. Communication by the computing host with the SSD controller is optionally and/or selectively via the driver and/or via the application. In a first example, all communication to the SSD controller is via the driver, and the application provides higher-level commands to the driver that the driver translates into specific commands for the SSD controller. In a second example, the driver implements a bypass mode and the application is enabled to send specific commands to the SSD controller via the driver. In a third example, a PCIe SSD controller supports one or more Virtual Functions (VFs), enabling an application, once configured, to communicate directly with the SSD controller, bypassing the driver.

According to various embodiments, some SSDs are compatible with form-factors, electrical interfaces, and/or protocols used by magnetic and/or optical non-volatile storage, such as HDDs, CD drives, and DVD drives. In various embodiments, SSDs use various combinations of zero or more parity codes, zero or more RS codes, zero or more BCH codes, zero or more Viterbi or other trellis codes, and zero or more LDPC codes.

FIG. 1A illustrates selected details of SSD 101 including SSD Controller 100 that implements optimization of read thresholds (e.g. via zero/one balance management and/or offline tracking techniques) for managing Non-Volatile Memory (NVM) elements (e.g., flash memories). SSD Controller 100 is communicatively coupled via one or more External Interfaces 110 to a host (such as host 102 of FIG. 1B). According to various embodiments, External Interfaces 110 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, SSD Controller 100 includes a SATA interface and a PCIe interface.

SSD Controller 100 is further communicatively coupled via one or more Device Interfaces 190 to NVM 199 including one or more storage devices, such as one or more of Flash Device 192. According to various embodiments, Device Interfaces 190 are one or more of: an asynchronous interface; a synchronous interface; a single-data-rate (SDR) interface; a double-data-rate (DDR) interface; a DRAM-compatible DDR or DDR2 synchronous interface; an ONFI compatible interface, such as an ONFI 2.2 or ONFI 3.0 compatible interface; a Toggle-mode compatible flash interface; a non-standard version of any of the preceding interfaces; a custom interface; or any other type of interface used to connect to storage devices.

Each Flash Device 192 has, in some embodiments, one or more individual Flash Die 194. According to type of a particular one of Flash Device 192, a plurality of Flash Die 194 in the particular Flash Device 192 is optionally and/or selectively accessible in parallel. Flash Device 192 is merely representative of one type of storage device enabled to communicatively couple to SSD Controller 100. In various embodiments, any type of storage device is usable, such as an SLC NAND flash memory, MLC NAND flash memory, NOR flash memory, flash memory using polysilicon or silicon nitride technology-based charge storage cells, two- or three-dimensional technology-based flash memory, read-only memory, static random access memory, dynamic random access memory, ferromagnetic memory, phase-change memory, racetrack memory, ReRAM, or any other type of memory device or storage medium.

According to various embodiments, Device Interfaces 190 are organized as: one or more busses with one or more of Flash Device 192 per bus; one or more groups of busses with one or more of Flash Device 192 per bus, where busses in a group are generally accessed in parallel; or any other organization of one or more of Flash Device 192 onto Device Interfaces 190.

Continuing in FIG. 1A, SSD Controller 100 has one or more modules, such as Host Interfaces 111, Data Processing 121, Buffer 131, Map 141, Recycler 151, ECC 161, Device Interface Logic 191, and CPU 171. The specific modules and interconnections illustrated in FIG. 1A are merely representative of one embodiment, and many arrangements and interconnections of some or all of the modules, as well as additional modules not illustrated, are conceived. In a first example, in some embodiments, there are two or more Host Interfaces 111 to provide dual-porting. In a second example, in some embodiments, Data Processing 121 and/or ECC 161 are combined with Buffer 131. In a third example, in some embodiments, Host Interfaces 111 is directly coupled to Buffer 131, and Data Processing 121 optionally and/or selectively operates on data stored in Buffer 131. In a fourth example, in some embodiments, Device Interface Logic 191 is directly coupled to Buffer 131, and ECC 161 optionally and/or selectively operates on data stored in Buffer 131.

Host Interfaces 111 sends and receives commands and/or data via External Interfaces 110, and, in some embodiments, tracks progress of individual commands via Tag Tracking 113. For example, the commands include a read command specifying an address (such as an LBA) and an amount of data (such as a number of LBA quanta, e.g., sectors) to read; in response the SSD provides read status and/or read data. For another example, the commands include a write command specifying an address (such as an LBA) and an amount of data (such as a number of LBA quanta, e.g., sectors) to write; in response the SSD provides write status and/or requests write data and optionally subsequently provides write status. For yet another example, the commands include a de-allocation command (e.g. a trim command) specifying one or more addresses (such as one or more LBAs) that no longer need to be allocated; in response the SSD modifies the Map accordingly and optionally provides de-allocation status. In some contexts an ATA compatible TRIM command is an exemplary de-allocation command. For yet another example, the commands include a super capacitor test command or a data hardening success query; in response, the SSD provides appropriate status. In some embodiments, Host Interfaces 111 is compatible with a SATA protocol and, using NCQ commands, is enabled to have up to 32 pending commands, each with a unique tag represented as a number from 0 to 31. In some embodiments, Tag Tracking 113 is enabled to associate an external tag for a command received via External Interfaces 110 with an internal tag used to track the command during processing by SSD Controller 100.

According to various embodiments, one or more of: Data Processing 121 optionally and/or selectively processes some or all data sent between Buffer 131 an External Interfaces 110; and Data Processing 121 optionally and/or selectively processes data stored in Buffer 131. In some embodiments, Data Processing 121 uses one or more Engines 123 to perform one or more of: formatting; reformatting; transcoding; and any other data processing and/or manipulation task.

Buffer 131 stores data sent to/from External Interface 110 from/to Device Interfaces 190. In some embodiments, Buffer 131 additionally stores system data, such as some or all map tables, used by SSD Controller 100 to manage one or more of Flash Device 192. In various embodiments. Buffer 131 has one or more of: Memory 137 used for temporary storage of data; DMA 133 used to control movement of data to and/or from Buffer 131; and ECC-X 135 used to provide higher-level error correction and/or redundancy functions; and other data movement and/or manipulation functions. An example of a higher-level redundancy function is a RAID-like capability, where redundancy is at a flash device (e.g., multiple ones of Flash Device 192) level and/or a flash die (e.g., Flash Die 194) level instead of at a disk level.

According to various embodiments, one or more of: ECC 161 optionally and/or selectively processes some or all data sent between Buffer 131 and Device Interfaces 190; and ECC 161 optionally and/or selectively processes data stored in Buffer 131. In some embodiments, ECC 161 is used to provide lower-level error correction and/or redundancy functions, such as in accordance with one or more ECC techniques. In some embodiments, ECC 161 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding. In some embodiments, ECC 161 includes one or more decoders (such as LDPC decoders).

Device Interface Logic 191 controls instances of Flash Device 192 via Device Interfaces 190. Device Interface Logic 191 is enabled to send data to/from the instances of Flash Device 192 according to a protocol of Flash Device 192. Device Interface Logic 191 includes Scheduling 192 to selectively sequence control of the instances of Flash Device 192 via Device Interfaces 190. For example, in some embodiments, Scheduling 193 is enabled to queue operations to the instances of Flash Device 192, and to selectively send the operations to individual ones of the instances of Flash Device 192 (or Flash Die 194) as individual ones of the instances of Flash Device 192 (or Flash Device 194) are available.

Map 141 converts between data addressing used on External Interfaces 110 and data addressing used on Device Interfaces 190, using Table 143 to map external data addresses to locations in NVM 199. For example, in some embodiments, Map 141 converts LBAs used on External Interfaces 110 to block and/or page addresses targeting one or more Flash Die 194, via mapping provided by Table 143. For LBAs that have never been written since drive manufacture or de-allocation, the Map points to a default value to return if the LBAs are read. For example, when processing a de-allocation command, the Map is modified so that entries corresponding to the de-allocated LBAs point to one of the default values. In various embodiments, there are various default values, each having a corresponding pointer. The plurality of default values enables reading some de-allocated LBAs (such as in a first range) as one default value, while reading other de-allocated LBAs (such as in a second range) as another default value. The default values, in various embodiments, are defined by flash memory, hardware, firmware, command and/or primitive arguments and/or parameters, programmable registers, or various combination thereof.

In some embodiments, Map 141 used Table 143 to perform and/or to look up translations between addresses used on External Interfaces 110 and data addressing used on Device Interfaces 190. According to various embodiments, Table 143 is one or more of: a one-level map; a two-level map; a multi-level map; a map cache; a compressed map; any type of mapping from one address space to another; and any combination of the foregoing. According to various embodiments, Table 143 includes one or more of: static random access memory; dynamic random access memory; NVM (such as flash memory); cache memory; on-chip memory; off-chip memory; and any combination of the foregoing.

In some embodiments, Recycler 151 performs garbage collection. For example, in some embodiments, instances of Flash Device 192 contain blocks that must be erased before the blocks are re-writeable. Recycler 151 is enabled to determine which portions of the instances of Flash Device 192 are actively in use (e.g., allocated instead of de-allocated), such as by scanning a map maintained by Map 141, and to make unused (e.g., de-allocated) portions of the instances of Flash Device 192 available for writing by erasing them. In further embodiments, Recycler 151 is enabled to move data stored within instances of Flash Device 192 to make larger contiguous portions of the instances of Flash Device 192 available for writing.

In some embodiments, instances of Flash Device 192 are selectively and/or dynamically configured, managed, and/or used to have one or more bands for storing data of different types and/or properties. A number, arrangement, size, and type of the bands are dynamically changeable. For example, data from a computing host is written into a hot (active) band, while data from Recycler 151 is written into a cold (less active) band. In some usage scenarios, if the computing host writes a long, sequential stream, then a size of the hot band grows, whereas if the computing host does random writes, then a size of the cold band grows.

CPU 171 controls various portions of SSD Controller 100. CPU 181 includes CPU Core 172. CPU Core 172 is, according to various embodiments, one or more single-core or multi-core processors. The individual processors cores in CPU Core 172 are, in some embodiments, multi-threaded. CPU Core 172 includes instruction and/or data caches and/or memories. For example, the instruction memory contains instructions to enable CPU Core 172 to execute programs (e.g. software sometimes called firmware) to control SSD Controller 100. In some embodiments, some or all of the firmware executed by CPU Core 172 is stored on instances of Flash Device 192 (as illustrated, e.g., as Firmware 106 of NVM 199 in FIG. 1B).

In various embodiments, CPU 171 further includes: Command Management 173 to track and control commands received via External Interfaces 110 while the commands are in progress; Buffer Management 175 to control allocation and use of Buffer 131; Translation Management 177 to control Map 141; Coherency Management 179 to control consistency of data addressing and to avoid conflicts such as between external data accesses and recycle data accesses; Device Management 181 to control Device Interface Logic 191; Identity Management 182 to control modification and communication of identify information, and optionally other management units. None, any, or all of the management functions performed by CPU 171 are, according to various embodiments, controlled and/or managed by hardware, by software (such as firmware executing on CPU Core 172 or on a host connected via External Interfaces 110), or any combination thereof.

In some embodiments, CPU 171 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to SSD Controller 100 and is compatible with operation with various computing hosts, such as via adaptation of Host Interfaces 111 and/or External Interfaces 110. The various computing hosts include on or any combination of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game.

In various embodiments, all or any portions of an SSD controller (or a computing-host flash memory controller) are implemented on a single IC, a single die of a multi-die IC, a plurality of dice of a multi-die IC, or a plurality of ICs. For example, Buffer 131 is implemented on a same die as other elements of SSD Controller 100. For another example, Buffer 131 is implemented on a different die than other elements of SSD Controller 100.

Figure 1B:
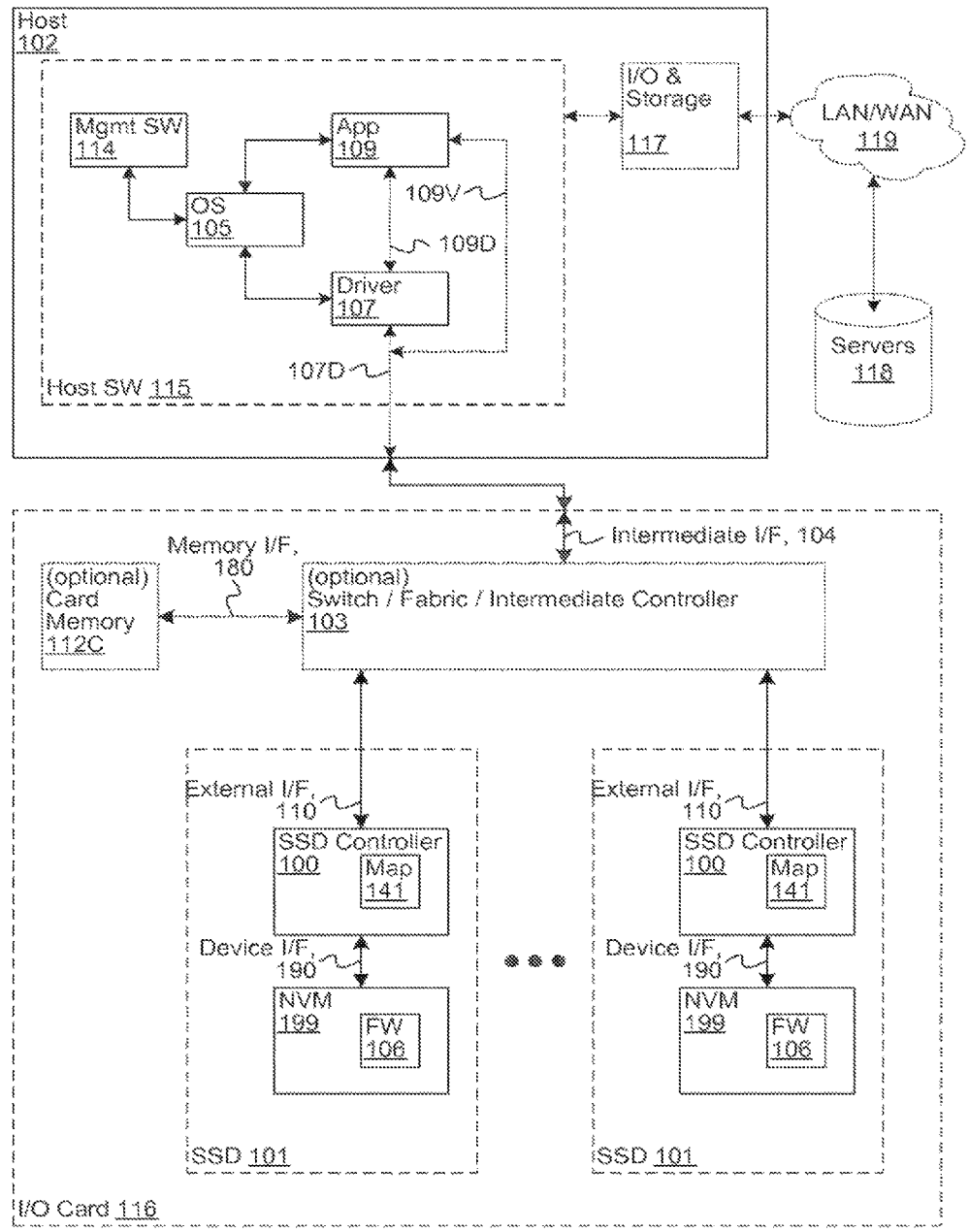
FIG. 1B illustrates selected details of various embodiments of systems including one or more instances of the SSD of FIG. 1A.

FIG. 1B illustrates selected details of various embodiments of systems including one or more instances of the SSD of FIG. 1A. SSD 101 includes SSD Controller 100 coupled to NVM 199 via Device Interfaces 190. The figure illustrates various classes of embodiments: a single SSD coupled directly to a host, a plurality of SSDs each respectively coupled directly to a host via respective external interfaces, and one or more SSDs coupled indirectly to a host via various interconnection elements.

As an example embodiment of a single SSD coupled directly to a host, one instance of SSD 101 is coupled directly to Host 102 via External Interfaces 110 (e.g. Switch/Fabric/Intermediate Controller 103 is omitted, bypassed, or passed-through). As an example embodiment of a plurality of SSDs each coupled directly to a host via respective external interfaces, each of a plurality of instances of SSD 101 is respectively coupled directly to Host 102 via a respective instance of External Interfaces 110 (e.g. Switch/Fabric/Intermediate Controller 103 is omitted, bypassed, or passed-through). As an example embodiment of one or more SSDs coupled indirectly to a host via various interconnection elements, each of one or more instances of SSD 101 is respectively coupled indirectly to Host 102. Each indirect coupling is via a respective instance of External Interfaces 110 coupled to Switch/Fabric/Intermediate Controller 103, and Intermediate Interfaces 104 coupling to Host 102.

Some of the embodiments including Switch/Fabric/Intermediate Controller 103 also include Card Memory 112C coupled via Memory Interface 180 and accessible by the SSDs. In various embodiments, one or more of the SSDs, the Switch/Fabric/Intermediate Controller, and/or the Card Memory are included on a physically identifiable module, card, or pluggable element (e.g. I/O Card 116). In some embodiments, SSD 101 (or variations thereof) corresponds to a SAS drive or a SATA drive that is coupled to an initiator operating as Host 102.

Host 102 is enabled to execute various elements of Host Software 115, such as various combinations of OS 105, Driver 107, Application 109, and Multi-Device Management Software 114. Dotted-arrow 107D is representative of Host Software ←→ I/O Device Communication, e.g. data sent/received to/from one or more of the instances of SSD 101 and from/to any one or more of OS 105 via Driver 107, Driver 107, and Application 109, either via Driver 107, or directly as a VF.

OS 105 includes and/or is enabled to operate with drivers (illustrated conceptually by Driver 107) for interfacing with the SSD. Various versions of Windows (e.g. 95, 98, ME, NT, XP, 2000, Server, Vista, and 7), various versions of Linus (e.g. Red Hat, Debian, and Ubuntu), and various versions of MacOS (e.g. 8, 9 and X) are examples of OS 105. In various embodiments, the drivers are standard and/or generic driver (sometimes termed "shrink-wrapped" or "pre-installed") operable with a standard interface and/or protocol such as SATA, AHCI, or NVM Express, or are optionally customized and/or vendor specific to enable use of commands specific to SSD 101. Some drives and/or drivers have pass-through modes to enable application-level programs, such as Application 109 via Optimized NAND Access (sometimes termed ONA) or Direct NAND Access (sometimes termed DNA) techniques, to communicate commands directly to SSD 101, enabling customized application to use commands specific to SSD 101 even with a generic driver. ONA techniques include one or more of: use of non-standard modifiers (hints); use of vendor-specific commands; communication of non-standard statistics, such as actual NVM usage according to compressibility; and other techniques. DNA techniques include one or more of: use of non-standard commands or vendor-specific providing unmapped read, write, and/or erase access to the NVM; use of non-standard or vendor-specific commands providing more direct access to the NVM, such as by bypassing formatting of data that the I/O device would otherwise do; and other techniques. Examples of the driver are a driver without ONA or DNA support, an ONA-enabled driver, a DNA-enabled driver, and an ONA/DNA-enabled driver. Further examples of the driver are a vendor-provided, vendor-developed, and/or vendor-enhanced driver, and a client-provided, client-developed, and/or client-enhanced driver.

Examples of the application-level programs are an application without ONA or DNA support, an ONA-enabled application, a DNA-enabled application, and an ONA/DNA-enabled application. Dotted-arrow 109D is representative of Application ←→ I/O Device Communication (e.g. bypass via a driver or bypass via a VF for an application), e.g. an ONA-enabled application and an ONA-enabled driver communicating with an SSD, such as without the application using the OS as an intermediary. Dotted-arrow 109V is representative of Application ←→ I/O Device Communication (e.g. bypass via a VF for an application), e.g. a DNA-enabled application and a DNA-enabled driver communicating with an SSD, such as without the application using the OS or the driver as intermediaries.

One or more portions of NVM 199 are used, in some embodiments, for firmware storage, e.g. Firmware 106. The firmware storage includes one or more firmware images (or portions thereof). A firmware image has, for example, one or more images of firmware, executed, e.g., by CPU Core 172 of SSD Controller 100. A firmware image has, for another example, one or more images of constants, parameter values, and NVM device information, referenced, e.g. by the CPU core during the firmware execution. The images of firmware correspond, e.g., to a current firmware image and zero or more previous (with respect to firmware updates) firmware images. In various embodiments, the firmware provides for generic, standard, ONA, and/or DNA operating modes. In some embodiments, one or more of the firmware operating modes are enabled (e.g. one or more APIs are "unlocked") via keys or various software techniques, optionally communicated and/or provided by a driver.

In some embodiments lacking the Switch/Fabric/Intermediate Controller, the SSD is coupled to the Host directly via External Interfaces 110. In various embodiments, SSD Controller 100 is coupled to the Host via one or more intermediate levels of other controllers, such as a RAID controller. In some embodiments, SSD 101 (or variations thereof) corresponds to a SAS driver or a SATA drive and Switch/Fabric/Intermediate Controller 103 corresponds to an expander that is in turn coupled to an initiator, or alternatively Switch/Fabric/Intermediate Controller 103 corresponds to a bridge that is indirectly coupled to an initiator via an expander. In some embodiments, Switch/Fabric/Intermediate Controller 103 includes one or more PCIe switches and/or fabrics.

In various embodiments, such as some of the embodiments where Host 102 is a computing host (e.g. a computer, a workstation computer, a server computer, a storage server, a SAN, a NAS device, a DAS device, a storage appliance, a PC, a laptop computer, a notebook computer, and/or a netbook computer), the computing host is optionally enabled to communicate (e.g. via optional I/O & Storage Devices/Resources 117 and optional LAN/WAN 119) with one ore more local and/or remote servers (e.g. optional Servers 118). The communication enables, for example, local and/or remote access, management, and/or usage of any one or more of SSD 101 elements. In some embodiments, the communication is wholly or partially via Ethernet. In some embodiments, the communication is wholly or partially via Fibre Channel. LAN/WAN 119 is representative, in various embodiments, of one or more Local and/or Wide Area Networks, such as any one or more of a network in a server farm, a network coupling server farms, a metro-area network, and the Internet.

In various embodiments, an SSD controller and/or a computing-host flash memory controller in combination with one or more NVMs are implemented as a non-volatile storage component, such as a USB storage component, a CF storage component, an MMC storage component, an eMMC storage component, a Thunderbolt storage component, a UFS storage component, an SD storage component, a Memory Stick storage component, and an xD-picture card storage component.

In various embodiments, all or any portions of an SSD controller (or a computing-host flash memory controller), or function thereof, are implemented in a host that the controller is to be coupled with (e.g., Host 102 of FIG. 1B). In various embodiments, all or any portions of an SSD controller (or a computing-host flash memory controller), or functions thereof, are implemented via hardware (e.g., logic circuitry), software and/or firmware (e.g., driver software or SSD control firmware), or any combination thereof. For example, functionality of or associated with an ECC unit (such as similar to ECC 161 and/or ECC-X 135 of FIG. 1A) is implemented partially via software on a host and partially via a combination of firmware and hardware in an SSD controller. For another example, functionality of or associated with a recycler unit (such as similar to Recycler 151 of FIG. 1A) is implemented partially via software on a host and partially via hardware in a computing-host flash memory controller.

Zero/One Balance Restoration

Figure 2A:
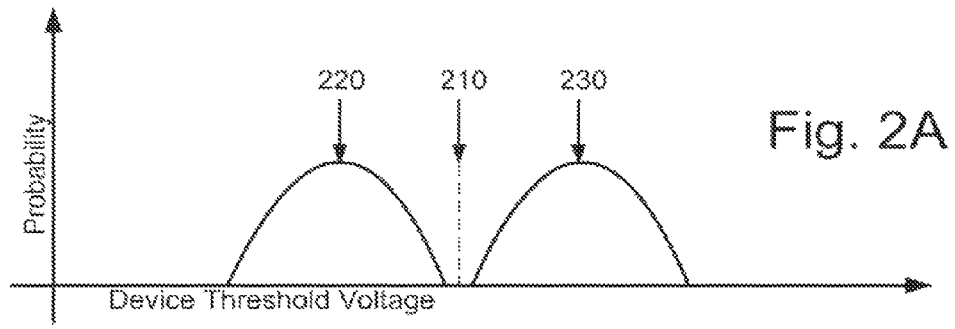
FIGS. 2A through 2D illustrate example device threshold voltage distributions relevant to zero/one balance restoration.
Figure 2B:
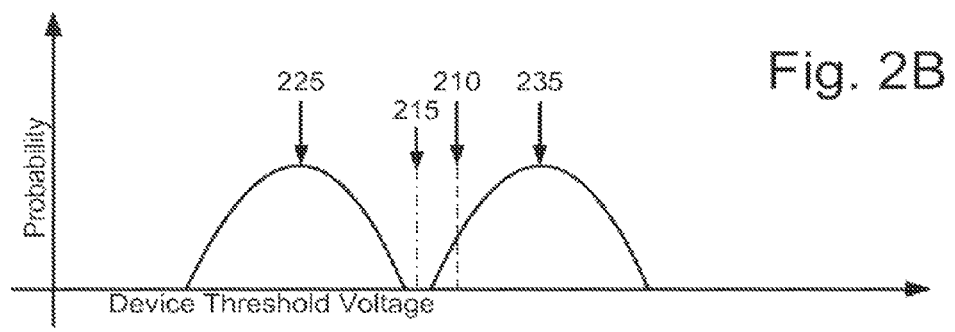
Figure 2C:
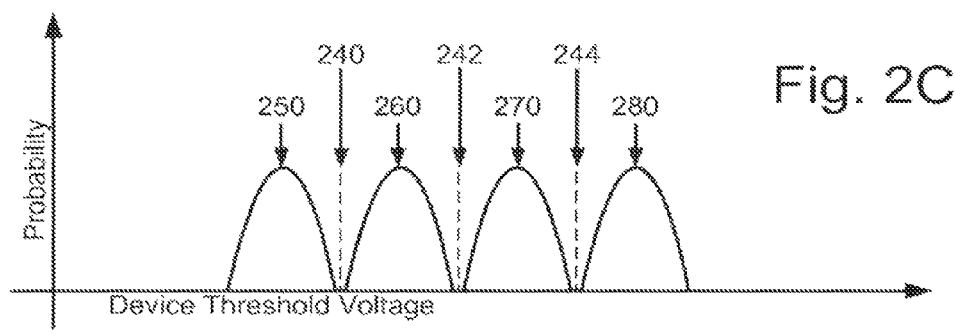
Figure 2D:
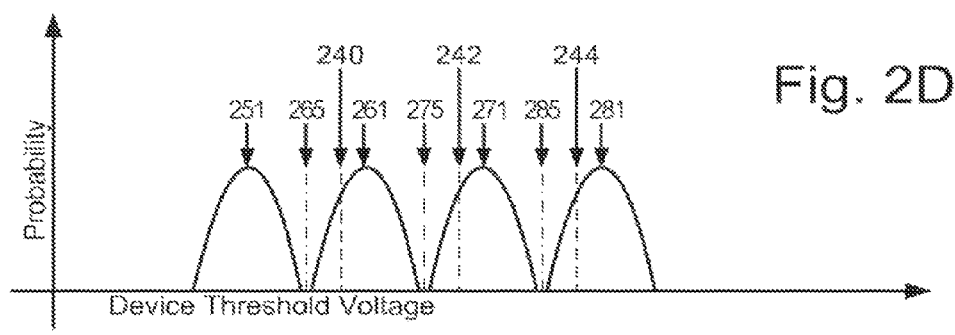

FIGS. 2A through 2D illustrate device threshold voltage distributions relevant to "zero/one" balance restoration. For the purposes of this discussion, each hill-like bump is an abstraction for an independent Gaussian-like curve representing a device threshold voltage probability distribution for a respective state of a read unit sized portion of an NVM. The device threshold voltage axis is drawn with increasing positive voltage to the right. An absolute scale is purposefully not provided, and no reference points are identified, such that the plots apply more generally to a larger population of NVMs. FIGS. 2A and 2B are SLC specific, while FIGS. 2C and 2D are MLC specific.

In FIG. 2A, representing an initial time (e.g., when the corresponding data is written), leftmost distribution 220 represents a logical one and the rightmost distribution 230 represents a logical zero. Depending on the technology, the leftmost distribution may reside (at least predominantly) at negative voltages. Read threshold 210 is ideally situated between the two distributions.

Except as linked by the embodiments herein, independent of these device threshold voltage distributions, in some embodiments, the NVM is written with specific knowledge of the statistical distribution of zeroes and ones being stored. More particularly, in some embodiments various encryption and/or scrambling techniques are used such that the statistical distribution of zeroes and ones is 50-50 percent (50 percent zeroes and 50 percent ones). When the SLC is read using the nominal read threshold, which is ideally situated for the case of FIG. 2A, the observed read data statistical distribution of zeroes and ones is likewise 50-50 percent. The statistical distribution being 50-50 percent does not mean that any one sample of data would have an exactly even balance of zero bits and one bits, but rather that an average over many samples produces a ratio of zero bits and one bits that converges on 50-50 percent with an increasingly tight probabilistic bound as a number of the sample increases. An analogy is a distribution of heads and tails when a coin is flipped many times, generating a Gaussian distribution with a variance that is approximately by n/4 where n is a number of the coin flips. For example, if there are 18,432 bits in a read unit with a 50-50 percent statistical distribution of zero bits and one bits, the variance in the number of zero bits (or one bits) is approximately 4,608 and the standard deviation is approximately 68. With a standard deviation of 68, less than one in one million samples of read units would be expected to have a number of zero bits more than 340 (S standard deviations) away from the average of 9,216.

In FIG. 2B, representing a later time, nominal read threshold 210 is as in FIG. 2A, and the two device threshold voltage distributions 225 and 235 are shifted with respect to their earlier respective distributions 220 and 230 in FIG. 2A. For the purposes of example, the two distributions are shown as having both uniformly shifted to the left (toward more negative voltages). It should be understood that more generally the two distributions are enabled to move independently of each other and in either a positive or negative direction.

In view of FIG. 2B, when the SLC is again read using the nominal read threshold 210, it is predictable that the observed statistical distribution of zeroes and ones read directly from the NVM (e.g., prior to any error correction) will not be 50-50 percent. More particularly, for the conceptual example given, an erroneous excess of ones is to be expected, as the read threshold is such that some of the zeroes will be falsely read as ones.

In practice, the direction of interference is reversed. That is, in practice, generally such shifts in the device threshold voltage distributions are not known or directly knowable. In some embodiments, instead the observation of a disparity in the zeroes and ones read from the NVM (with respect to the known stored distribution of zeroes and ones) is used to infer the existence of shifts in the device threshold voltage distributions. Furthermore, in these embodiments, the read threshold is adjusted based at least in part on the disparity observed (as detailed elsewhere herein) to read threshold 215, as required until the zero/one balance is restored.

Similarly, FIG. 2C represents an initial time (such as when the corresponding data is written) with initial device threshold voltage distributions, while FIG. 2D represents a later time with corresponding later device threshold voltage distributions. More specifically, for a selected Gray code mapping, respectively representing the 11, 10, 00, and 00 states, device threshold voltage distributions 251, 261, 271, and 281 (of FIG. 2D) are shifted with respect to their earlier respective device threshold voltage distributions 250, 260, 270, and 280 (of FIG. 2C). Three nominal (initial) read thresholds are also known $V_{READ1}$ 240, $V_{READ2}$ 242, and $V_{READ3}$ 244. Again for the purposes of example, in FIG. 2D the four distributions are shown as having all uniformly shifted to the left (toward more negative voltages). It should be understood that more generally the four distributions are enabled to move independently of each other an din either a positive or negative direction.

In some embodiments, various scrambling techniques are used such that the statistical distribution of the four states is 25-25-25-25 percent (25 percent in each state). When the MLC is read using the nominal read thresholds that are ideally situated for the case of FIG. 2C, in some embodiments the statistical distribution of the four states is configurable to likewise be 25-25-25-25 percent. (As discussed elsewhere, zeroes and ones are directly observable by the controller, but all four states are inferable as required.) In some embodiments, the observation of a disparity (a deviation from the expected 25-25-25-25 percent) read from the NVM (with respect to the known stored distribution of states) is used to infer the existence of shifts in the device threshold voltage distributions. The read thresholds are then adjusted (as detailed elsewhere herein) as shown in FIG. 2D to become $V_{READ1}$ 265, $V_{READ2}$ 275, and $V_{READ3}$ 285. In some embodiments, the read threshold adjustments are performed separately for lower page reads (adjusting $V_{READ2}$ 275) and upper page reads (adjusting $V_{READ1}$ 265 and/or $V_{READ3}$ 285).

Functions for Zero/One Balance Restoration

Figure 3:
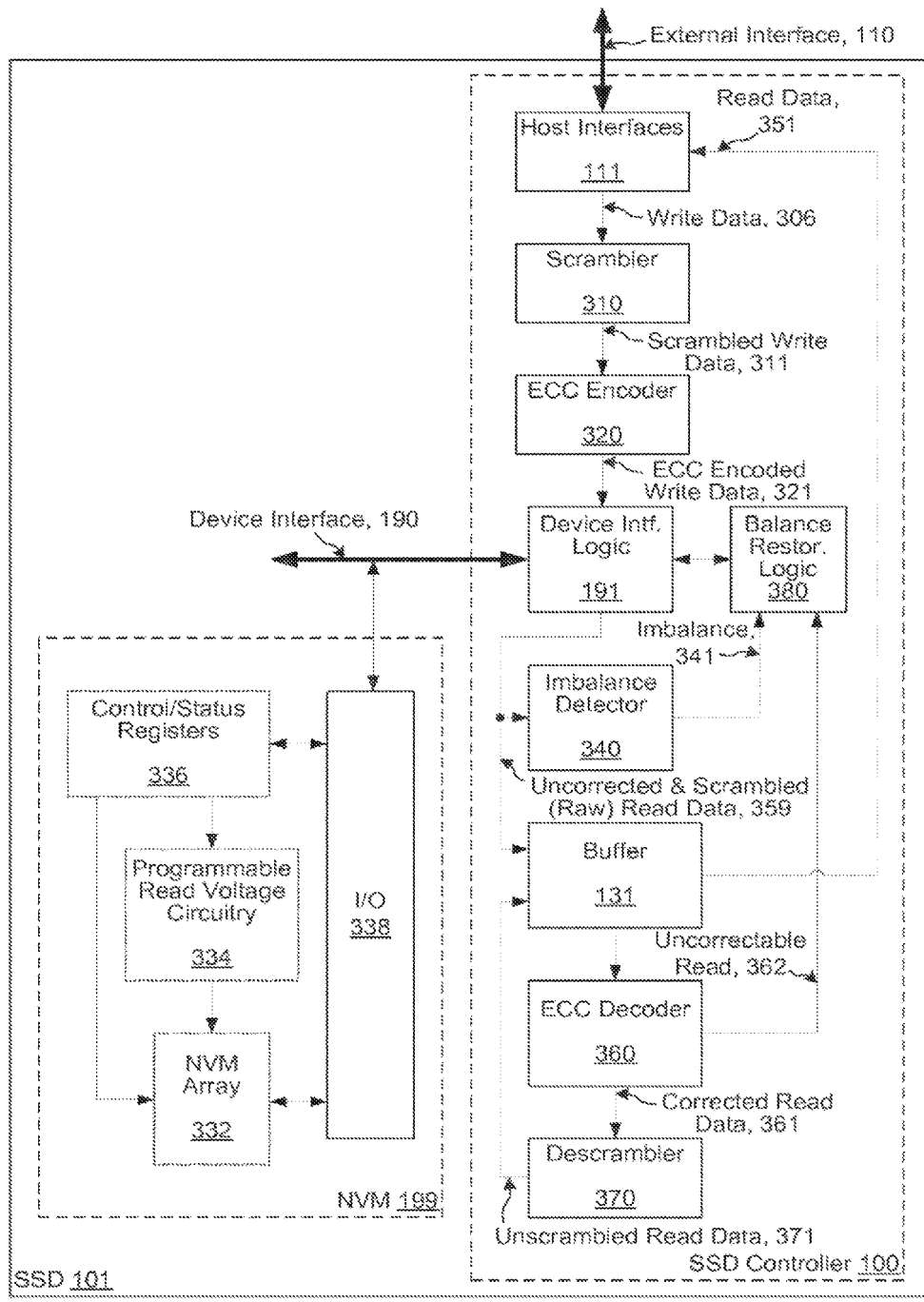
FIG. 3 illustrates selected details of a system embodiment of an instance of the SSD of FIG. 1A, providing particular details regarding zero/one balance management and offline tracking.

FIG. 3 provides alternate views of SSD 101, SSD Controller 100, and NVM 199 of FIGS. 1A and 1B, redrawing selected logic block boundaries to emphasize particular functions. SSD 101 at the top level features External Interface 110, SSD Controller 100, NVM 199, and Device Interface 190.

External Interface 110 is coupled to a host, such as Host 102 of FIG. 1B, and supports a high-level storage protocol such as SATA, comprising host-sourced storage-related commands and write-data and controller-sourced read-data, and as detailed in the above discussion of FIG. 1A. Device Interface 190 supports low-level NVM I/O transactions, as detailed in the discussion of FIG. 1A. NVM 199 features NVM Array 332, Programmable Read Voltage Circuitry 334, Control/Status Registers 336, and I/O 338. SSD Controller 100 features Host Interfaces 111, Scrambler 310, ECC Encoder 320, Device Interface Logic 191, Imbalance Detector 340, Buffer 131, ECC Decoder 360, Descrambler 370, and Balance Restoration Logic 380. Host Interfaces 111 couples with the Host via External Interface 110 as discussed previously, provides Write Data 306 to Scrambler 310, and receive Read Data 351 from Buffer 131.

The write path and functionality are as follows. Scrambler 310 operates on Write Data 306 to generate Scrambled Write Data 311 to ECC Encoder 320. Scrambler 310 scrambles Write Data 306 in a reversible manner and such that the Scrambled Write Data 311 has a known statistical distribution of states stored. An example of a block comprising scrambled data is a block containing Scrambled Write Data 311. E.g. an SLC block comprising scrambled data contains an equal number of '0' and '1' values and a 4LC block comprising scrambled data contains an equal number of '00', '01', '10', and '11' states. In some embodiments, Scrambler 310 performs encryption, such as via an AES encoder that randomizes the data as a by-product of encryption. In some embodiments, Scrambler 310 uses a Linear Feedback Shift Register (LFSR) to randomize the data (but without any data security intent). ECC Encoder 320 processes the Scrambled Write Data 311 to add additional ECC bits, resulting in ECC Encoded Write Data 321 that is provided to Device Interface 191 for storing into NVM 199 via Device Interface 190.

The basic read path and functionality are as follows. NVM pages, comprising Uncorrected and Scrambled (Raw) Read Data 359, are received from NVM 199 via Device Interface 190. Continuing with respect to FIG. 3, each read unit nominally comprises the data scrambled by Scrambler 301 as well as the additional ECC bits generated by ECC Encoder 320, but as generally unintentionally altered as a result of NVM storage and retrieval operations. The read units are provided to ECC Decoder 360 via Buffer 131. ECC Decoder 360 processes the read units, exploiting the included additional ECC bits are generally correct any errors that may have arisen at any point and time since the data was first ECC encoded, resulting in Corrected Read Data 361, which is provided to Descrambler 370. The Descrambler 370 operates on the Corrected Read Data 361, reversing the scrambling performed by Scrambler 310, resulting in Unscrambled Read Data 371 that is provided as Read Data 351 to Host Interfaces 111 via Buffer 131.

The read path and functionality further includes Imbalance Detector 340 and Balance Restoration Logic 360. Imbalance Detector 340 monitors Raw Read Data 359 received from the NVM, and at least temporarily maintains data on the statistical distributions of state. Balance Restoration Logic 380 interacts with NVM Control/Status Registers 336, via Device Interface Logic 191 and NVM I/O 338, to selectively adjust NVM read thresholds (used to read the NVM Array 332) via NVM Programmable Read Voltage Circuitry 334. An example of NVM read thresholds are current read thresholds referred to in FIGS. 5A and 5B. In some embodiments, NVM read thresholds are written to Control/Status Register 336 and configure Programmable Read Voltage Circuitry 334. The read thresholds are adjusted based upon a) Uncorrectable Read 362 detected by ECC Decoder 360, and b) Imbalance 341 (in the statistical of state) detected by Imbalance Detector 340. The read unit is binary data in both SLC and MLC embodiments. Disparities in the zeroes and ones are directly measurable in the SLC case (or when an MLC is operated as though it were an SLC). In some embodiments, disparities in the more than two states of an MLC are inferred based on knowledge of how the data was stored in the NVM.

FIG. 3 illustrates functions for zero/one balance restoration in a context where a host operates as a source and a sink for data written to and read from NVM 199. In various embodiments (such as illustrated by FIG. 1A and FIG. 1B), one or more other agents operate as sources and sinks for data written to and read from NVM 199. An example of the other agents is Recycler 151 of FIG. 1A, that moves data from one location to another in NVM 199, as described elsewhere herein.

In various embodiments, any or all portions of functionality associated with any one or more of Scrambler 310, ECC Encoder 320, ECC Encoder 360, and Descrambler 370 are implemented at least in part using one or more of Data Processing 121 and ECC 161 (both of FIG. 1A).

Control Flows for Zero/One Balance Restoration

Figure 4:
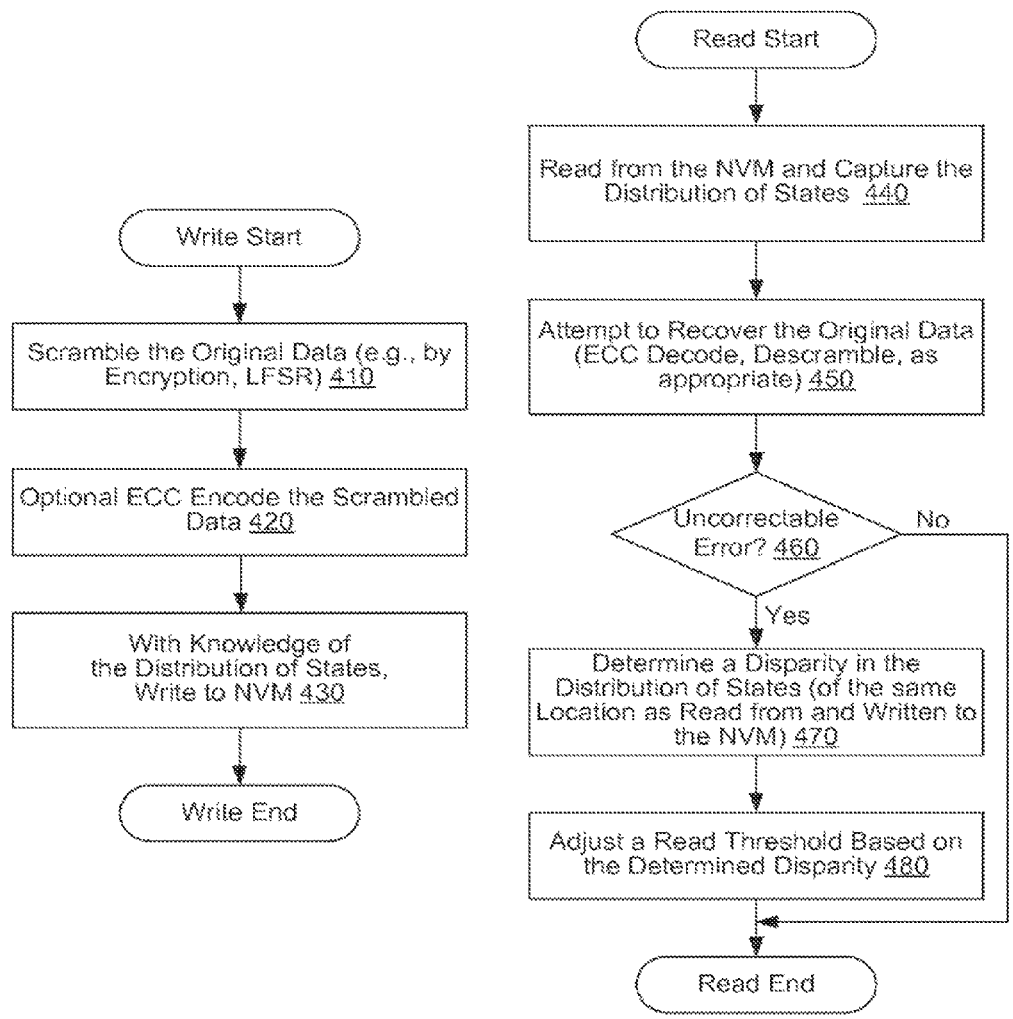
FIG. 4 illustrates selected control flow details for an embodiment of the SSD of FIGS. 1A, 1B, and 3, providing particular details regarding write related operations (actions 410 through 430) and read related operations (actions 440 through 480).

FIG. 4 illustrates selected control flow details for an embodiment of the SSD of FIGS. 1A, 1B, and 3, providing particular details regarding write related operations and read related operations. Write operations start with action 410 and continue through 430. While a return path is not explicitly drawn, subsequent write operations start anew with action 410. Similarly, read operations start with action 440, continue through 460, and conditionally continue through 480. While a return path is not explicitly drawn, subsequent read operations start anew with action 440. It is assumed that at least an initial write precedes a read to the same location. Otherwise, except for contrived cases, such as in testing, the read operations and write operations are generally invoked independently as application needs dictate, for the same or generally different locations. Nevertheless, in a heuristic example, the first read operation 440 conceptually continues immediately after the last write operation 430 for the same location.

Considering in more detail the write related operations, original data to be written to the NVM is generally first scrambled in action 410, such as via encryption or use of an LFSR. Except where more specificity is employed, the term "scrambling" as used herein refers to the manipulation of the original data to be written via any manipulation or selection that results in a known statistical distribution among the various states stored in the NVM. Scrambling methods include encryption and LFSR techniques. (See also Scrambler 310 of FIG. 3.) In some encryption embodiments, the scrambling is in accordance with at least one version of the AES encryptions specification. In some LFSR embodiments, the scrambling is in accordance with at least one choice of LFSR. In some embodiments, the scrambling is more directly determined via the selection of one or more test patterns, providing a chosen statistical distribution of states when written to the NVM (without necessarily using encryption or LFSR processing).

The LFSR is a hardware shift register having a combinational logic feedback network generating an input bit from a linear function of selected taps of the shift register, or a software model thereof. The LFSR generates a deterministic pseudorandom sequence. At least conceptually, the LFSR-generated pseudorandom sequence is modulo 2 added to the original data to provide the scrambled data.

Subsequently, the scrambled data is next optionally ECC encoded, as illustrated in action 420. (See also ECC Encoder 320 of FIG. 3.) ECC encoding provides redundant information that facilitates data recovery (via error correction) in the face of errors that arise for a variety of reasons when using NVM. Such errors are more prevalent, and thus ECC encoding more advisable, with one or more of smaller geometries, greater use, greater age, greater temperature excursions, and use of MLC memories.

The scrambled and optionally ECC encoded data is then written to the NVM, as shown in action 430, the last of the write related operations. The distribution of states being written is known as a result of the scrambling. In the case of the use of SLC memories and AES encryption, the zero-one distribution is known to be 50-50 (i.e., 50 percent zeroes and 50 percent ones). In the case of the use of a 4LC (4-level MLC) memories and AES encryption, the distribution after writing both lower and upper pages is known to be 25-25-25-25 (i.e., 25 percent in each of the four states).

In some embodiments, at least one reference region is dedicated for the use of one or more test patterns as discussed above. In some embodiments, the location of the reference region is selected to minimize (or conversely, to maximize) the impact on the test patterns of various NVM write/read artifacts. In some embodiments, the reference region is a reference page, and its location is chosen to be a last page written in a block, so as to minimize the impact of write disturbs on the data written. As some of the phenomena affecting the voltage distributions are time and/or temperature variant, the reference region serves as a known measure of these effects on zero/one disparity.

Considering in more detail the read related operations, starting in action 440, one or more read units are read from the NVM and the distribution of states is captured. In some embodiments, each of a zeroes count and a ones count are directly determined. Next, in action 450, an attempt is made to recover the original data. This performs the inverse of whatever data manipulation operations were performed prior to writing. ECC encoding was optionally added prior to writing, and thus the read units next optionally undergo ECC decoding. (See also ECC Decoder 360 of FIG. 3.) On a per read unit basis, if ECC decoding is successful, then descrambling is performed next, as appropriate. E.g., where AES encryption was used prior to writing, AES-decryption is performed. Or, when an LFSR-generated pseudorandom sequence was used, the same sequence is modulo 2 added to the ECC decoded data from the read unit.

The read related operations conclude early when the original data is recoverable, either without error or for errors that are correctable via ECC decoding. See the "no" path from decision 460. However, on uncorrectable errors of any of the read units, actions 470 and 480 are also performed. See the "yes" path from decision 460. In action 470, a disparity in the distribution of states is evaluated. (See also Imbalance Detector 340 of FIG. 3.) In some embodiments, the determined disparity is a determined difference between the zeroes count and the ones count. In various embodiments, the determined disparity is computed over all of the read units, even if less than all of the read units had uncorrectable (e.g. hard-decision decode) errors.

Next, in action 480 an adjusted value (a.k.a. a threshold shift) for at least one read threshold is determined at least in part based on the magnitude of the determined disparity. In some embodiments, if the magnitude of the determined disparity is below a predetermined tolerance, the read threshold is not adjusted. In some embodiments, a multifactor "correction algorithm" is employed for determining the adjusted read threshold, for which the magnitude of the determined disparity is but one factor.

In some embodiments, the correction algorithm takes the form of a lookup table used to select a replacement value for the read threshold. The magnitude of the determined disparity is the basis for at least part of the index in the lookup table. In some embodiments, the lookup tables is pre-characterized (weighted) based on the particular vendor of the NVM being used. In some embodiments, the index has additional components, comprising one or more of: program/erase cycles, age, retention time (time since the last write), temperature, and any other factors that may pertain to drift of, or disturbances to, the device threshold voltages distributions of the NVM. (See also Balance Restoration Logic 380 of FIG. 3.)

Here and throughout the detailed description, it should be remembered that in commonly used flash memory microarchitectures, granularity of operations is different; e.g. a read unit is a minimum size for reading, a page is a minimum size for writing (e.g. programming), and a block is a minimum size for erasing. Each block includes a corresponding plurality of pages, and each page includes a corresponding plurality of read units. In various embodiments, an SSD controller reads from and/or writes to one or more flash memories in quanta corresponding to any one or more of: one or more read units, one or more pages, and one or more blocks.

In some embodiments, disparities are evaluated on an entire page basis. In some embodiments, disparities are evaluated on a read unit basis. The disparity evaluation performed in conjunction with an uncorrectable (e.g. hard-decision decode) error on a read is performed with respect to the same (page, or read unit) location as written in the most recent write that included that same location.

Optimization of Read Thresholds

Figure 5A:
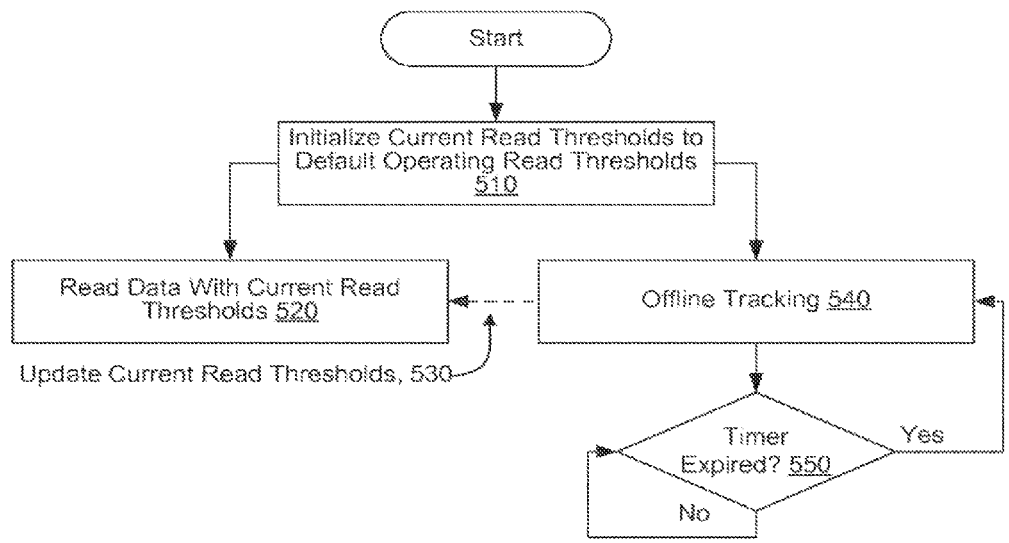
FIG. 5A illustrates a flow diagram of selected details of an embodiment of optimizing of read thresholds for an NVM (e.g. of an SSD).
Figure 5B:
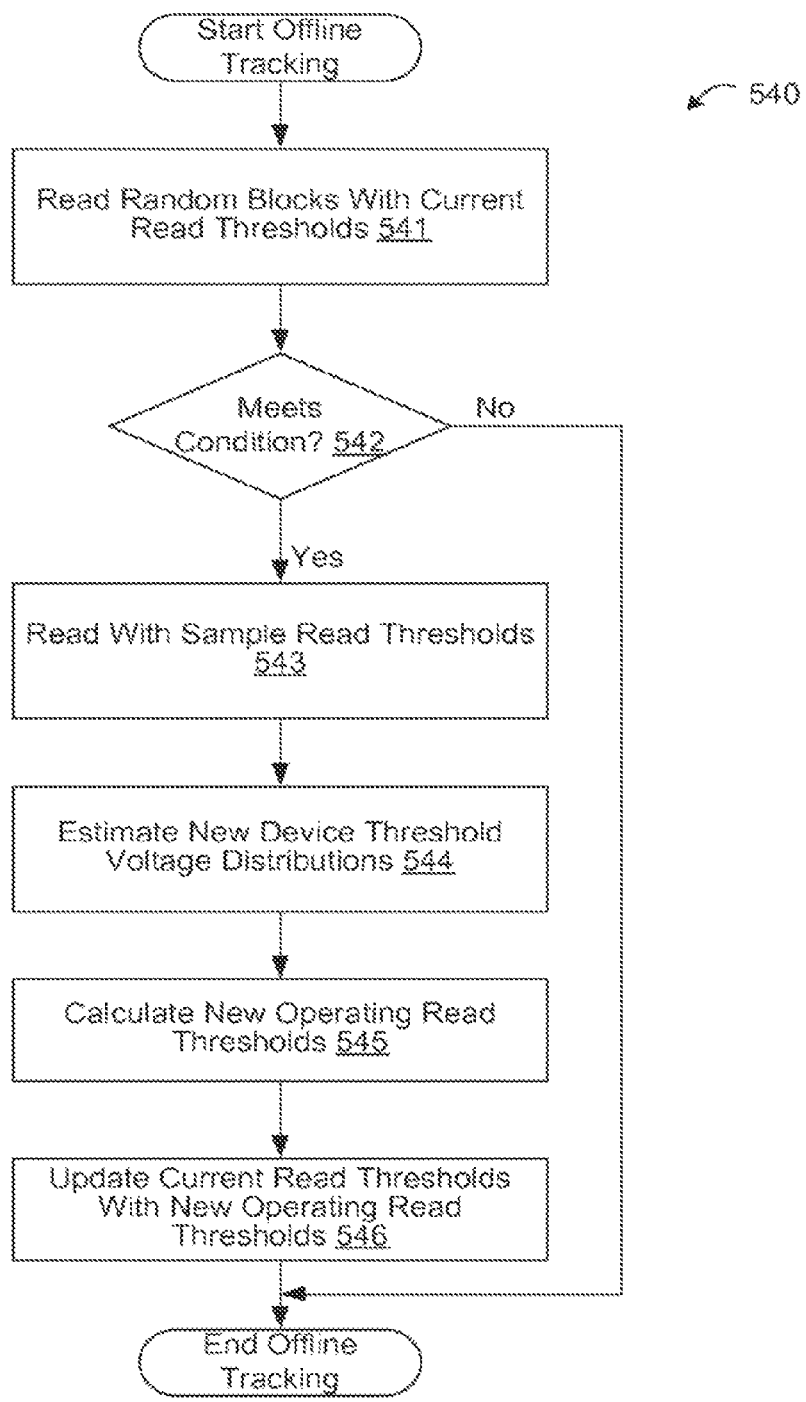
FIG. 5B illustrates a flow diagram of selected details of an embodiment of Offline Tracking 540 of device threshold voltage in a managed group of blocks of an NVM.

Embodiments represented by FIG. 4 adjust at least one read threshold in response to an uncorrectable (e.g. hard-decision decode) error. Embodiments represented by FIGS. 5A, 5B, and 6 adjust at least one read threshold in response to any one or more of manufacturing characterization, initial use, a timer (e.g. periodic, irregular, or random), a bit error rate that is above a threshold, and an uncorrectable (e.g. hard-decision decode) error. Various embodiments represented by FIGS. 5A, 5B, and 6 are operated in contexts where blocks of NVM are managed in groups, and adjustment of at least one read threshold for all of the blocks of a particular group is based on partial reads of a sampling of the blocks of the particular group. For example, if at least some of the partial reads meet a condition, then the read threshold is adjusted for all of the blocks of the particular managed group. In various embodiments, the adjusting is via estimating device threshold voltage distributions using techniques applicable to Gaussian distributions. In some embodiments, techniques represented by FIG. 4 are used in conjunction with techniques represented by FIGS. 5A and 5B.

FIG. 5A illustrates a flow diagram of selected details of an embodiment of optimizing of read thresholds for an NVM (e.g. of an SSD). In various embodiments, the NVM is provided with default operating read thresholds specified by a manufacturer of the NVM and guaranteed by the manufacturer to function correctly. Reading a read unit of the NVM is performed in accordance with current read thresholds. Initially, the current read thresholds are set to the default operating read thresholds, in action 510. In some embodiments, the default operating read thresholds are written to Control/Status Register 336 and configure Programmable Read Voltage Circuitry 334 of FIG. 3.

Reads of the NVM are performed in accordance with the current read thresholds, in action 520. Conceptually in parallel with the reads of action 520, the controller also performs Offline Tracking 540 on one or more managed groups of blocks that contain at least some data retrieved by the reads of action 520, as described elsewhere herein. The Offline Tracking is enabled to update the current read thresholds with new operating read thresholds, in action 530, that are optimized to improve one or more of performance, power consumption, and reliability. In some embodiments, the new operating read thresholds are written to the Control/Status Register 336 and configure Programmable Read Voltage Circuitry 334 of FIG. 3. In various embodiments, subsequent reads are performed in accordance with current read thresholds that have been updated to the new operating read thresholds update by the Offline Tracking. The Offline Tracking is described as operating conceptually in parallel with the reads, in that at least in some embodiments, reads of the NVM in action 520 are performed such that reads of the NVM in action 540 are prevented from being performed simultaneously with the reads of the NVM in action 520. For example, the reads of the NVM in action 520 are performed at a higher priority than the reads of the NVM inaction 540. For another example, the reads of the NVM in action 540 are performed in a background manner, such as when the NVM is otherwise idle.

In various embodiments, the SSD periodically re-evaluate the current read thresholds. A timer tracks time elapsed since the last Offline Tracking was performed, in action 550. When the timer expires, the Offline Tracking is performed again. In some embodiments, the timer is configurable through any one or more of software, firmware, and hardware. In some embodiments, the timer is configured to one or more weeks.

FIG. 5B illustrates a flow diagram of selected details of an embodiment of Offline Tracking 540 of device threshold voltages in a managed group of blocks of an NVM.

Offline tracking reduces the number of read errors in a managed group of blocks by adjusting the current read thresholds as the device threshold voltage distributions shift (e.g. due to aging). Reducing the number of errors improves performance, reduces power consumption and/or improves the lifetime of an NVM. In some embodiments, offline tracking is performed in whole and/or incrementally when an SSD, any portions of NVM used in an SSD, or any portions of NVM used in any context, are idle, to reduce the impact on operations other than the offline tracking (e.g. accesses from a host, recycling, and/or map management). In various embodiments, an advantage of offline tracking is that it estimates the device threshold voltage distribution shift without maintaining reference information (e.g. a reference block or a reference read unit), or storing device threshold voltage distribution information, thus reducing overhead.

In various embodiments, a managed group of blocks are managed to share at least one determined characteristic. Examples of a determined characteristic include any one or more of a number of programs cycles, a number of erase cycles, and a programming window. In some usage scenarios, blocks with similar program/erase counts and/or retention behave similarly. Because the managed group of blocks is managed to share determined characteristics, randomly selected blocks are representative of the group of managed blocks. In some embodiments, the managed group of blocks is a managed group of blocks comprising scrambled data. An example of a managed group of blocks is an R-block.

One or more representative blocks are randomly selected from the managed group of blocks. All data within the representative blocks is read in accordance with the current read thresholds, in action 541. E.g., reading all read units within the representative blocks.

If action 542 determines that a read unit in the representative blocks meets a condition, then in response the current read thresholds of the read unit are adjusted by writing new operating read thresholds to Control/Status Register 336 and configuring Programmable Read Voltage Circuitry 334 of FIG. 3. If the read unit does not meet the condition, then in response the current read thresholds are left unchanged and the Offline Tracking ends. In some embodiments, the condition is one or more of exceeding a target BER at the current read thresholds and exceeding a target disparity of the zero/one balance at the current read thresholds.

In some embodiments, exceeding a target BER and/or target disparity of the zero/one balance at the current read threshold indicates that the device threshold voltage distributions have shifted to new device threshold voltage distributions. The target BER and/or target disparity of zero/one balance is configurable through any one or more of hardware, firmware, and software. In some embodiments, the target BER is set to one half the correctable BER (e.g. if up to 80 bits per read are correctable, then the target BER is set to 40 bits per read). In various embodiments, ECC Decoder 360 of FIG. 3 detects the BER during a read of a read unit.

In action 543, the read unit is read in accordance with sample read thresholds to sample and characterize the new device threshold voltage distributions. In some embodiments, the sample read thresholds comprise two sets of sample read thresholds. A first set of sample read thresholds is computed, based on the old read thresholds. The read unit is read in accordance with the first set of sample read thresholds, and based on the results, a second set of sample read thresholds is computed and the read unit is read in accordance with the second set of sample read thresholds.

In some embodiments, six LSB sample read thresholds (used, e.g., by six respective array accesses) are sufficient to characterize the new device threshold voltage distributions for a 4LC memory. The new device threshold voltage distributions are Gaussian, thus two LSB samples are sufficient to determine respective mean and standard deviation of each of the new device threshold voltage distributions. The first set of sample read thresholds is computed, as described elsewhere herein, e.g. Equation 1.10, 1.11, and 1.12 (Equations 1.1-1.15 are described in Appendix "Selected Details of Particular Embodiments of Optimization of Read Thresholds" attached, and incorporated by reference for all purposes). The read unit is read in accordance with the first set of sample read thresholds to generate a second set of sample read thresholds, as described elsewhere herein, e.g. Equations 1.13, 1.14, and 1.15, that are statistically valid for blocks comprising scrambled data. In other embodiments, two LSB sample read thresholds and two MSB sample read thresholds are sufficient to estimate the new device threshold voltage distributions.

Based on at least some of the results of reading the read unit in accordance with the sample read thresholds, the new device threshold voltage distributions are estimated 544. As illustrated in FIGS. 6A-D, the means and the standard deviations of D1' 621, D2' 622, and D3' 623 are estimated. In some embodiments, some results of reads performed in accordance with the sample read thresholds are used to look-up intermediate values in a Q-table with a binary tree search. The intermediate values and some of the results are used to compute the estimated means and standard deviations of the new device threshold voltage distributions.

The new operating read thresholds are calculated 545, based upon the estimated means and standard deviations of the new device threshold voltage distributions. In some embodiments, E' 620 cannot be estimated, because the erasure level is not measurable. In some embodiments, the three new operating read thresholds ($V_{NEW1}$ 650, $V_{NEW2}$ 651, and $V_{NEW3}$ 652) are calculated using Equations 1.7 and 1.8.

Once the new operating read thresholds have been calculated, the current read thresholds are updated to the new operating read thresholds for the read unit in the representative blocks, in action 546. In some embodiments, the current read thresholds for other (e.g. other than the representative) blocks within the managed group of blocks are also updated to the calculated new operating read thresholds. In various embodiments, multiple representative blocks are selected for processing via offline tracking as a set, and the new operating read thresholds are averaged for the set to reduce block-to-block variation within a managed group of blocks.

In various embodiments, one or more operations (or portions thereof) illustrated in FIGS. 5A and 5B are performed by and/or managed by an SSD controller (such as SSD Controller 100 of FIG. 1A) or elements thereof. For example, in some embodiments, on or more operations illustrated in FIGS. 5A and 5B are implemented by and/or managed by firmware executed by CPU Core 172 of FIG. 1A. In various embodiments, one or more operations (or portions thereof) illustrated in FIGS. 5A and 5B are performed by and/or managed by any one or more elements illustrated in FIG. 3. For example, in some embodiments, detection of exceeding a target disparity of zero/one balance (e.g. as performed by some embodiments of Meets Condition? 542) is performed at least in part by Imbalance Detector 340 of FIG. 3.

Figure 6A:
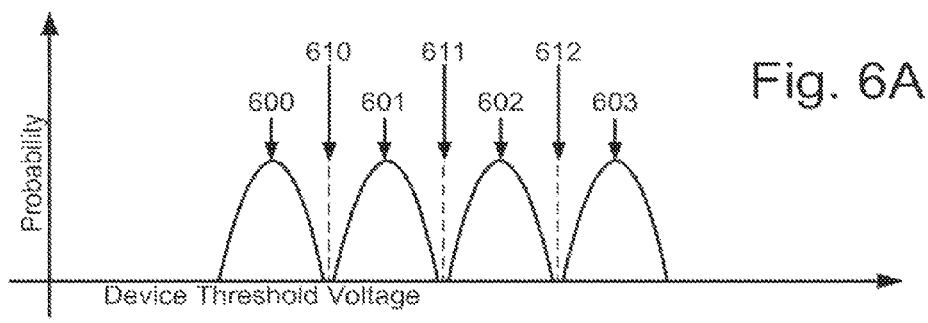
FIGS. 6A through 6D conceptually illustrate device threshold voltage distributions in an 4LC memory.

FIGS. 6A through 6D conceptually illustrate device threshold voltage distributions in a 4LC memory. For the purposes of this discussion, as in FIGS. 2A through 2D, each hill-like bump is an abstraction for an independent Gaussian-like curve representing a device threshold voltage probability distribution for a respective state of a read unit sized portion of an NVM. The device threshold voltage axis is drawn with increasing positive voltage to the right. An absolute scale is purposefully not provided, and no reference points are identified, such that the plots apply more generally to a larger population of NVMs. FIG. 6A conceptually illustrates a 4LC memory that stores two bits per cell. There are four device threshold voltage distributions (E 600, D1 601, D2 602, and D3 603), with three current read thresholds ($V_{OLD1}$ 610, $V_{OLD2}$ 611, and $V_{OLD3}$ 612) that delineate the device threshold voltage distributions corresponding to the different states.

Figure 6B:
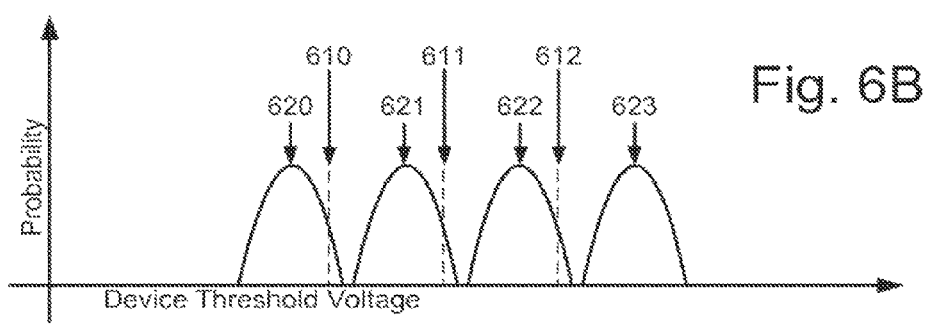

FIG. 6B conceptually illustrates a 4LC with shifted device threshold voltage distributions. There are four new device threshold voltage distributions (E' 620, D1' 621, D2' 622, and D3' 623). Note that the three current read thresholds no longer cleanly separate the new device threshold voltage distributions. For example, some parts of D2' 622 lie to the right of $V_{OLD3}$ 612 and would be incorrectly identified.

Figure 6C:
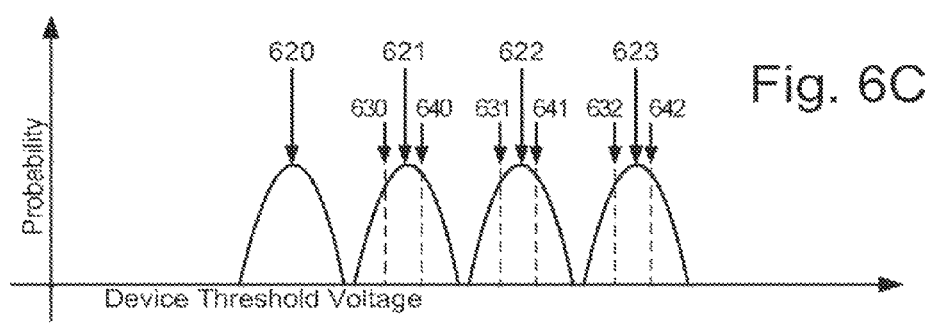

FIG. 6C conceptually illustrates sample read thresholds in a 4LC with shifted device threshold voltage distributions. In various embodiments, FIG. 6C conceptually illustrates the sample read thresholds used in action 543. There are six sample LSB read thresholds used to estimated the new device threshold voltage distributions. The first set of sample read thresholds ($V_{SAMPLE1,1}$ 630, $V_{SAMPLE2,1}$ 631, and $V_{SAMPLE3,1}$ 632) are chosen to fall close to the centers of D1 601, D2 602, and D3 603. In some usage scenarios, the first set of sample read thresholds are relatively close to the centers of D1' 621, D2' 622, and D3' 623. The first set of sample read thresholds is computed, as described elsewhere herein, e.g. Equations 1.10, 1.11, and 1.12.

The second set of sample read thresholds ($V_{SAMPLE1,2}$ 640, $V_{SAMPLE2,2}$ 641, and $V_{SAMPLE3,2}$ 642) are chosen to fall within D1' 621, D2' 622, and D3' 623, but offset from the first set and lying on different sides of the centers of D1' 621, D2' 622, and D3' 623. The read unit is read in accordance with the first set of sample read thresholds to generate a second set of sample read thresholds, as described elsewhere herein, e.g. Equations 1.13, 1.14, and 1.15.

Figure 6D:
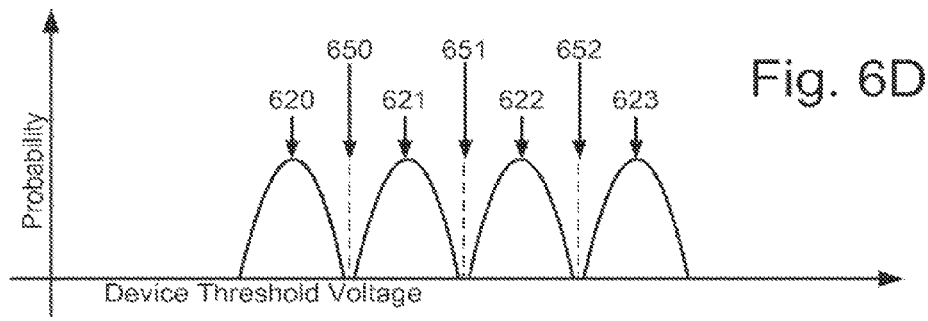

FIG. 6D conceptually illustrates new operating read thresholds in a 4LC with shifted device threshold voltage distributions. The new operating read thresholds $V_{NEW1}$ 650, $V_{NEW2}$ 651, and $V_{NEW3}$ 652 are calculated by the Offline Tracking. Note that in contrast to the current read thresholds ($V_{OLD1}$, $V_{OLD2}$, and $V_{OLD3}$), the new operating read thresholds ($V_{NEW1}$, $V_{NEW2}$, and $V_{NEW3}$) cleanly separate the new device threshold voltage distributions, thus reducing the likelihood of a bit error and/or an uncorrectable (e.g. hard-decision decode) error. In various embodiments, FIG. 6D conceptually illustrates the new operating read thresholds from Calculate New Operating Read Thresholds 545.

APPENDIX

Selected Details of Particular Embodiments of Optimization of Read Thresholds

An Appendix entitled "Selected Details of Particular Embodiments of Optimization of Read Thresholds" is attached to this application and is incorporated by reference for all purposes in this application. The Appendix describes, for example, Equations 1.1-1.15, referred to elsewhere herein.

Example Implementation Techniques

In some embodiments, various combinations of all or portions of operations performed by an SSD using optimization of read threshold, e.g., with flash memories, a computing-host flash memory controller, and/or an SSD controller (such as SSD Controller 100 of FIG. 1A), and portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, or layout descriptions. Example descriptions include: Verilog, VHDL, SPICE, SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as wholly or partially cell-based integrated circuit), and a full-custom technique (such as an integrated circuit that is substantially specialized), any combination thereof, or any other technique compatible with design and/or manufacturing of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java, VBscript, and Shell). One or more of the program instructions, the language statements, or the binary instructions, are optionally stored on one or more computer readable storage medium elements. In various embodiments, some, all, or various portions of the program instructions are realized as one or more functions, routines, sub-routines, in-line routines, procedures, macros, or portions thereof.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designation used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranged specified, maximum and minimum values used, or other particular specifications (such as flash memory technology types; and the number of entries or stages in registers and buffers), are merely those of the described embodiments, are expected to track improvements and changes in implementation technology, and should not be construed as limitations.

Functionally equivalent techniques known in the art are employed instead of those described to implement various components, sub-systems, operations, functions, routines, sub-routines, in-line routines, procedures, macros, or portions thereof. It is also understood that many functional aspects of embodiments are realizable selectively in either hardware (e.g., generally dedicated circuitry) or software (e.g., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A device comprising:
 a controller configured to optimize a read threshold voltage for a memory by:
  determining statistical characteristics of two adjacent memory levels partly based on a type of statistical distribution of the memory levels and a distribution of data storage values in the memory levels, the determining including reading data from the memory using a first threshold voltage and determining a second threshold voltage having a second distribution of data values that has an opposite ratio of ones and zeros as compared to the distribution of data values from the first threshold voltage;
  computing an optimized read threshold voltage associated with the two adjacent memory levels by using the statistical characteristics of the two adjacent memory levels; and
  updating the read threshold voltage with the optimized read threshold voltage.

2. The device of claim 1 wherein the type of statistical distribution is Gaussian.

3. The device of claim 1 wherein the distribution of data storage values in the memory levels is about an equal number of zeroes and ones.

4. The device of claim 1 wherein the statistical characteristics for each adjacent memory level are mean and standard deviation.

5. The device of claim 1 wherein the computing the optimized read threshold voltage is based on the equation $$\theta_X^{opt} = \frac{\sigma_{adj}\mu_X + \sigma_X\mu_{adj}}{\sigma_{adj} + \sigma_X}.$$

6. The device of claim 1 wherein the optimization is performed for a page of the memory.

7. The device of claim 1 wherein the optimization is performed responsive to data read errors of the memory.

8. The device of claim 1 wherein the determining is responsive to two valid least significant bit (LSB) reads.

9. The device of claim 1 wherein known data in the memory levels is not required.

10. A method for optimizing read threshold voltages of a multi-level cell memory comprising:
 determining if data read from the memory has errors greater than a predetermined error value;
 reading the data again with first and second voltage thresholds for each level of the memory, the second voltage threshold selected to produce an opposite ratio of ones and zeros as compared to the data read with the first voltage threshold;
 determining means and standard deviations for each level from the data read again with the first and second voltage thresholds partly based on a type of statistical distribution of each memory level and a distribution of data storage values in each memory level;
 computing optimal read threshold voltages based on the means and standard deviations of two adjacent levels; and
 updating the read threshold voltages with the optimized read threshold voltages.

11. The method of claim 10 wherein the type of statistical distribution is Gaussian.

12. The method of claim 10 wherein the distribution of data storage values in the memory levels is about an equal number of zeroes and ones.

13. The method of claim 10 wherein the computing the optimized read threshold voltage is based on the equation $$\theta_X^{opt} = \frac{\sigma_{adj}\mu_X + \sigma_X\mu_{adj}}{\sigma_{adj} + \sigma_X}.$$

14. The method of claim 10 wherein the determining means and standard deviations for each level is based on the equation:

$$\int_{\frac{\mu-\theta_x^i}{\sigma}}^{\infty} \frac{1}{\sqrt{2\pi}} e^{-x^2/2} dx = 4\left(\frac{w(B_L^i)}{L_P} - 0.5\right), i = 1, 2, 3;$$

where x is the memory level and i is the data read with a threshold voltage.

15. The method of claim 10 wherein the determining is responsive to two valid least significant bit (LSB) reads.

16. The method of claim 10 wherein known data in the memory levels is not required.

17. A data storage device comprising:
a processor;
a memory coupled to the processor and storing instructions, that when executed by the processor, cause the processor to:
  determine statistical characteristics of two adjacent memory levels partly based on a type of statistical distribution of the memory levels and a distribution of data storage values in the memory levels, the statistical characteristics determined using a first read threshold sampling point that yields a first ratio of ones and zeros and using a second read threshold sampling point that yields a second ratio of ones and zeros substantially opposite to the first ratio relative to an equilibrium point based on the statistical distribution;
  compute an optimized read threshold voltage associated with the two adjacent memory levels by using the statistical characteristics of the two adjacent memory levels; and
  update the read threshold voltage with the optimized read threshold voltage.

18. The data storage device of claim 17 wherein the optimization is performed for a page of the memory.

19. The data storage device of claim 17 wherein the optimization is performed responsive to data read errors of the memory.

20. The data storage device of claim 17 wherein the determining is responsive to two valid least significant bit (LSB) reads.

* * * * *